(12) United States Patent
Saitou et al.

(10) Patent No.: US 10,481,008 B2
(45) Date of Patent: Nov. 19, 2019

(54) RADIANT HEAT SENSOR

(71) Applicant: DENSO CORPORATION, Kariya, Aichi-pref. (JP)

(72) Inventors: Keita Saitou, Kariya (JP); Atusi Sakaida, Kariya (JP); Toshikazu Harada, Kariya (JP); Hirohito Matsui, Nishio (JP); Yukikatsu Ozaki, Nishio (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/749,794

(22) PCT Filed: Jul. 5, 2016

(86) PCT No.: PCT/JP2016/069930
§ 371 (c)(1),
(2) Date: Feb. 2, 2018

(87) PCT Pub. No.: WO2017/022392
PCT Pub. Date: Feb. 9, 2017

(65) Prior Publication Data
US 2018/0231420 A1  Aug. 16, 2018

(30) Foreign Application Priority Data
Aug. 5, 2015  (JP) .................................. 2015-155131

(51) Int. Cl.
*G01J 5/12* (2006.01)
*G01J 5/02* (2006.01)
(Continued)

(52) U.S. Cl.
CPC . *G01J 5/12* (2013.01); *G01J 5/02* (2013.01); *G01J 5/046* (2013.01); *G01J 5/0809* (2013.01);
(Continued)

(58) Field of Classification Search
CPC .. G01J 5/12; G01J 2005/123; G01J 2005/126; H01L 35/00; H01L 35/02; H01L 35/04; H01L 35/12; H01L 35/32
See application file for complete search history.

(56) References Cited

U.S. PATENT DOCUMENTS 4,029,521 A * 6/1977 Korn ......................... G01J 5/12
136/225
5,695,283 A  12/1997 Johnson
(Continued)

FOREIGN PATENT DOCUMENTS

FR          2781931 A1     2/2000
JP          S57086729 A    5/1982
(Continued)

*Primary Examiner* — Michael C Bryant
(74) *Attorney, Agent, or Firm* — Harness, Dickey & Pierce, P.L.C.

(57) ABSTRACT

In a radiant heat sensor, first and second thermoelectric members are alternately arrayed one by one in a direction along a first surface of a plate-shaped member so as to be separated from each other, and each of the first and second thermoelectric members configure a portion of the first surface. First conductor patterns extend the first surface, disposed on the first surface so as to span a single first thermoelectric member and a single second thermoelectric member that are adjacent to each other, and configure hot contact portions between the first and second thermoelectric members. Second conductor patterns extend along the first surface, disposed on the first surface so as to span a single first thermoelectric member and a single second thermoelectric member that are adjacent to each other, and configure cold contact portions between the first and second thermoelectric members.

12 Claims, 31 Drawing Sheets

(51) Int. Cl.
  *H01L 35/32*  (2006.01)
  *H01L 35/34*  (2006.01)
  *G01J 5/04*  (2006.01)
  *G01J 5/08*  (2006.01)
  *G01J 1/02*  (2006.01)

(52) U.S. Cl.
  CPC .............. *H01L 35/32* (2013.01); *H01L 35/34* (2013.01); *G01J 1/02* (2013.01); *G01J 2005/123* (2013.01)

(56) References Cited

U.S. PATENT DOCUMENTS

| | | | |
|---|---|---|---|
| 6,203,194 B1* | 3/2001 | Beerwerth | G01P 13/00 136/227 |
| 2003/0133489 A1* | 7/2003 | Hirota | G01J 5/08 374/121 |
| 2005/0105582 A1 | 5/2005 | Thery et al. | |
| 2006/0169902 A1 | 8/2006 | Watanabe | |
| 2015/0144171 A1 | 5/2015 | Taniguchi et al. | |
| 2016/0129817 A1 | 5/2016 | Shimizu et al. | |
| 2017/0213953 A1 | 7/2017 | Taniguchi et al. | |

FOREIGN PATENT DOCUMENTS

| | | |
|---|---|---|
| JP | H03196583 A | 8/1991 |
| JP | H07120329 A | 5/1995 |
| JP | H09218090 A | 8/1997 |
| JP | 2005512040 A | 4/2005 |
| JP | 2011018688 A | 1/2011 |
| JP | 2011191215 A | 9/2011 |
| JP | 2014007376 A | 1/2014 |
| JP | 2014007408 A | 1/2014 |
| JP | 2014007409 A | 1/2014 |
| JP | 2015013636 A | 1/2015 |
| JP | 2017085179 A | 5/2017 |

* cited by examiner

RADIANT HEAT SENSOR

CROSS-REFERENCE TO RELATED APPLICATIONS

This application is a U.S. National Phase Application under 35 U.S.C. 371 of International Application No. PCT/JP2016/069930 filed on Jul. 5, 2016 and published in Japanese as WO 2017/022392 A1 on Feb. 9, 2017. This application is based on and claims the benefit of priority from Japanese Patent Application No. 2015-155131, filed on Aug. 5, 2015. The entire disclosures of all of the above applications are incorporated herein by reference.

TECHNICAL FIELD

The present disclosure relates to a radiant heat sensor that detects thermal energy of radiant heat using a thermoelectric conversion element.

BACKGROUND ART

As a type of radiant heat sensor, there is an infrared sensor described in PTL 1. The infrared sensor in PTL 1 detects infrared rays using a thermoelectric conversion element.

CITATION LIST

Patent Literature

[PTL 1] JP-A-2011-18688

SUMMARY OF INVENTION

Technical Problem

The inventors of the present invention have reviewed a radiant heat sensor J1 that has a structure shown in FIG. 6, as a radiant heat sensor that uses a thermoelectric conversion element. This radiant heat sensor is referred to hereafter as a radiant heat sensor J1 of a consideration example. As a result, the inventors have found that the radiant heat sensor J1 of the consideration example has low detection sensitivity for the following reason.

As shown in FIG. 6, in the radiant heat sensor J1 of the consideration example, a first thermoelectric member J31 and a second thermoelectric member J32 are alternately arrayed in direct contact on one surface 10a of a plate-shaped member. The thermoelectric conversion element is configured by the first thermoelectric member J31 and the second thermoelectric member J32 being alternately connected in series. The first thermoelectric member J31 and the second thermoelectric member J32 have two joining portions J41 and J42 on the one surface 10a of the plate-shaped member. One of the two joining portions J41 and J42 is a hot contact portion J41. The other of the two joining portions J41 and J42 is a cold contact portion J42.

The radiant heat sensor J1 of the consideration example detects the thermal energy of radiant heat in the following manner. When radiant heat is irradiated onto the one surface 10a side of the plate-shaped member, the hot contact portion J41 and the cold contact portion J42 receive heat due to the radiant heat. At this time, a temperature difference occurs between the hot contact portion J41 and the cold contact portion J42 as a result of a difference in the quantities of heat received by the hot contact portion J41 and the cold contact portion J42. Then, the first thermoelectric member J31 and the second thermoelectric member J32 generate electrical output based on the temperature difference. The thermal energy of radiant heat is detected from the electrical output in this manner.

For example, the following case can be given as a case in which the hot contact portion J41 and the cold contact portion J42 receive heat due to radiant heat. The case is that in which the radiant heat sensor J1 has a heat-receiving plate 51 and a reflective plate 52 on the one surface 10a of the plate-shaped member. The heat-receiving plate 51 absorbs radiant heat and generates heat. The reflective plate 52 reflects radiant heat. The hot contact portion J41 receives heat from the heat-receiving plate 51. In addition, the cold contact portion J42 receives heat from the reflective plate 52. In this case, when radiant heat is irradiated onto the radiant heat sensor J1, the heat-receiving plate 51 absorbs the radiant heat and generates heat. The reflective plate 52 reflects the radiant heat. Therefore, the quantity of heat received by the hot contact portion J41 from the heat-receiving plate 51 and the quantity of heat received by the cold contact portion J42 from the reflective plate 52 differ.

Here, in the radiant heat sensor J1 of the consideration example, the hot contact portion J41 and the cold contact portion J42 on the one surface 10a of the plate-shaped member are both linear in shape. Therefore, heat-receiving areas over which the hot contact portion J41 and the cold contact portion J42 respectively receive heat from the heat-receiving plate 51 and the reflective plate 52 are small. As a result, the temperature difference between the hot contact portion J41 and the cold contact portion J42 that occurs when radiant heat is irradiated onto the radiant heat sensor J1 is small. The electrical output generated by the first thermoelectric member J31 and the second thermoelectric member J32 becomes small. That is, the detection sensitivity of the radiant heat sensor J1 becomes low.

An object of the present disclosure is to provide a radiant heat sensor that uses a thermoelectric conversion element, the radiant heat sensor having high detection sensitivity.

Solution to Problem

An aspect of the present disclosure includes:

a plate-shaped member that has a first surface and a second surface on a side opposite the first surface, the plate-shaped member including a plurality of first thermoelectric members and a plurality of second thermoelectric members that are made of differing thermoelectric materials, in which the plurality of first thermoelectric members and the plurality of second thermoelectric members are alternately arrayed one by one in a direction along the first surface so as to be separated from each other, and each of the plurality of first thermoelectric members and plurality of second thermoelectric members configure a portion of the first surface;

a plurality of first conductor patterns that extend along the first surface, disposed on the first surface of the plate-shaped member so as to span one of the plurality of first thermoelectric members and one of the plurality of second thermoelectric members that are adjacent to each other, among the plurality of first thermoelectric members and the plurality of second thermoelectric members, and configure hot contact portions between the plurality of first thermoelectric members and the plurality of second thermoelectric members; and a plurality of second conductor patterns that extend along the first surface, disposed on the first surface of the plate-shaped member so as to span one of the plurality of first thermoelectric members and one of the plurality of second thermoelectric members that are adjacent to each other, among the plurality of first thermoelectric members and the plurality of second thermoelectric members, and configure cold contact portions between the plurality of first thermoelectric members and the plurality of second thermoelectric members, wherein when radiant heat is irradiated onto the first surface side of the plate-shaped member, the plurality of first conductor patterns and the plurality of second conductor patterns receive heat due to the radiant heat, a temperature difference occurs between the plurality of first conductor patterns and the plurality of second conductor patterns as a result of quantities of heat received by the plurality of first conductor patterns and the plurality of second conductor patterns differing, and the plurality of first thermoelectric members and the plurality of second thermoelectric members generate electrical output based on the temperature difference.

As a result, because the hot contact portion is configured by the first conductor pattern and the cold contact portion is configured by the second conductor pattern, heat-receiving areas over which the hot contact portion and the cold contact portion respectively receive heat can be increased, compared to cases in which the hot contact portion and the cold contact portion are each made of a linearly shaped joining portion when the first thermoelectric member and the second thermoelectric member are joined in direct contact. Therefore, the temperature difference between the hot contact portion and the cold contact portion can be increased, and the electrical output generated by the first thermoelectric member and the second thermoelectric member can be increased. Consequently, according to an aspect of the present disclosure, a radiant heat sensor that has high detection sensitivity can be provided.

so as to

According to an aspect of the present disclosure, in cases in which the plurality of first conductor patterns and the plurality of second conductor patterns receive heat due to radiant heat and quantities of heat received by the plurality of first conductor patterns and the plurality of second conductor patterns differ, the following cases are included.

For example, in cases in which the radiant heat sensor includes a heat-receiving member that transmits heat generated as a result of absorption of radiant heat to the plurality of first conductor patterns, the heat-receiving area of the hot contact portion when the plurality of first conductor patterns receive heat from the heat-receiving member can be increased.

In addition, in cases in which the plurality of first conductor patterns of the radiant heat sensor are configured to absorb more radiant heat than the plurality of second conductor patterns, the heat-receiving areas of the plurality of first conductor patterns when the plurality of first conductor patterns receive radiant heat can be increased.

Reference numbers within the parentheses of means recited in the claims are examples indicating corresponding relationships with specific means described according to embodiments described hereafter.

BRIEF DESCRIPTION OF DRAWINGS

The above-described object, other objects, characteristics, and advantages of the present disclosure will be clarified through the detailed description herebelow, with reference to the accompanying drawings. In the drawings.

DESCRIPTION OF EMBODIMENTS

Embodiments of the present disclosure will hereinafter be described with reference to the drawings. Sections that are identical or equivalent to each other among the following embodiments are described using the same reference numbers.

First Embodiment

According to the present embodiment, a radiant heat measurement apparatus that uses a radiant heat sensor of the present disclosure will be described.

Figure 1:
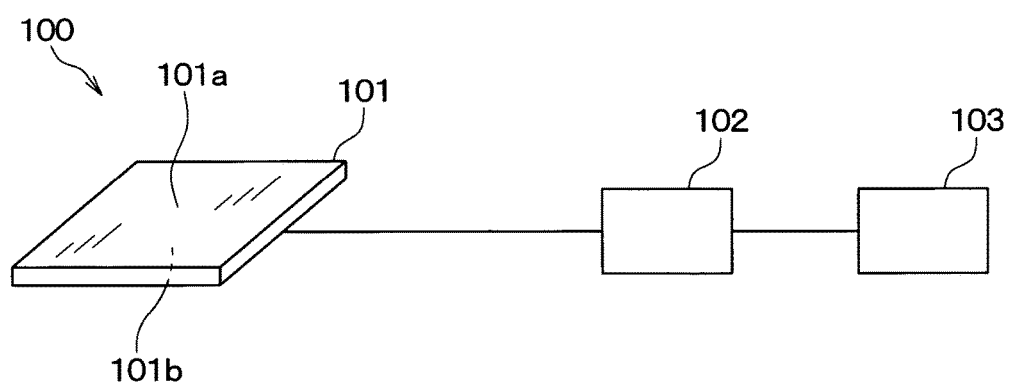
FIG. 1 is a diagram showing an overall configuration of a radiant heat measurement apparatus according to a first embodiment.

As shown in FIG. 1, a radiant heat measurement apparatus 100 includes a radiant heat sensor 101, a calculating unit 102, and a display unit 103. The radiant heat sensor 101 is plate-shaped, and has one surface 101a and another surface 101b on a side opposite the one surface 101a. A thermoelectric conversion element is provided inside the radiant heat sensor 101. The radiant heat sensor 101 generates an electrical output based on the heat quantity of radiant heat. The calculating unit 102 calculates the heat quantity of radiant heat, that is, heat flux based on the electrical output from the radiant heat sensor 101. The display unit 103 displays the heat flux calculated by the calculating unit 102.

Figure 2:
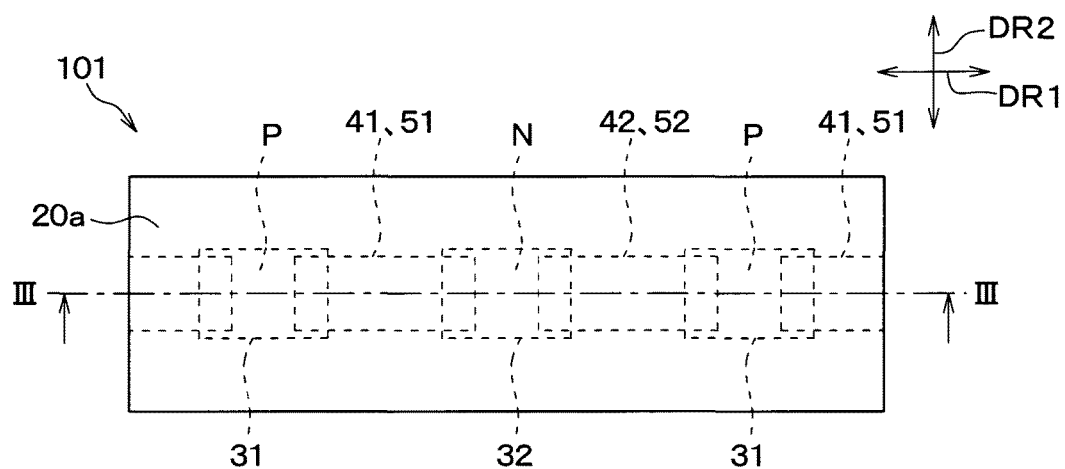
FIG. 2 is a plan view of a radiant heat sensor in FIG. 1.
Figure 3:
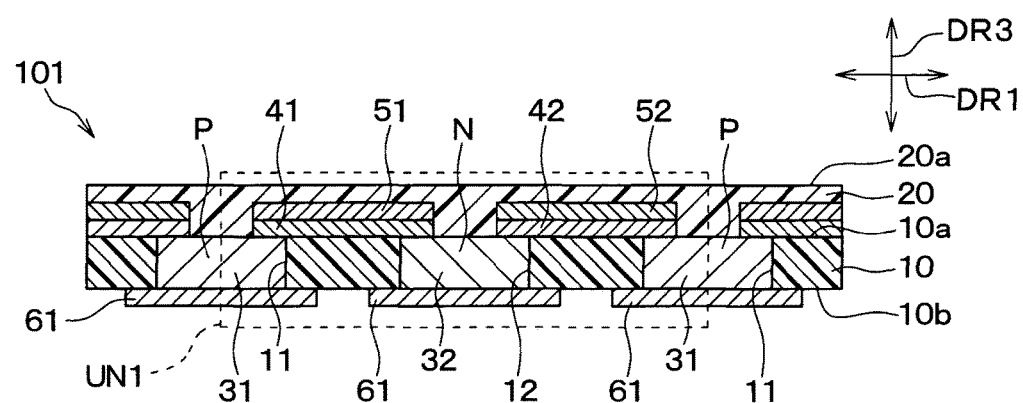
FIG. 3 is a cross-sectional view taken along line in FIG. 2.

As shown in FIGS. 2 and 3, the radiant heat sensor 101 is configured by a multi-layer substrate in which a plurality of insulating layers 10 and 20 are laminated. A first direction DR1 and a second direction DR2 in FIG. 2 indicate two orthogonal directions on a plane of the radiant heat sensor 101. A third direction DR3 in FIG. 3 indicate a thickness direction of the radiant heat sensor 101, that is, a direction perpendicular to a front surface 10a of an insulating substrate 10.

According to the present embodiment, the multi-layer substrate has a two-layer structure in which two layers, that is, the insulating layers 10 and 20 are laminated. The two layers, that is, the insulating layers 10 and 20 are the insulating substrate 10 and a front-surface protective member 20. A front surface 20a of the front-surface protective member 20 is a front surface 101a of the radiant heat sensor 101.

The insulating substrate 10 is a plate-shaped member that has the front surface 10a and a back surface 10b. The front surface 10a is one surface and corresponds to a first surface of the plate-shaped member. The back surface 10b is another surface on the side opposite the one surface and corresponds to a second surface of the plate-shaped member. The insulating substrate 10 is made of a thermoplastic resin that is a flexible material. For example, polyether ether ketone (PEEK), polyetherimide (PEI), and liquid-crystal polymer (LCP) are suitable as the thermoplastic resin.

A plurality of first via holes 11 and a plurality of second via holes 12 are formed in the insulating substrate 10. The first and second via holes 11 and 12 are both through holes that pass through the front surface 10a and the back surface 10b of the insulating substrate 10. The first and second via holes 11 and 12 are arranged so as to be alternately arrayed at a predetermined interval.

A first thermoelectric member 31 is embedded in the first via hole 11. A second thermoelectric member 32 is embedded in the second via hole 12. The first thermoelectric member 31 and the second thermoelectric member 32 are made of thermoelectric materials (also referred to as thermoelectric conversion materials) that differ in property, so as to achieve the Seebeck effect. According to the present embodiment, the first thermoelectric member 31 is made of a P-type semiconductor material. The second thermoelectric member 32 is made of an N-type semiconductor material. The P-type semiconductor material is a metal compound in which a powder of a Bi—Sb—Te alloy that forms the P-type material has undergone solid-phase sintering so as to retain a crystalline structure of a plurality of metal atoms before sintering. The N-type semiconductor material is a metal compound in which a powder of a Bi—Te alloy that forms the N-type material has undergone sold-phase sintering so as to retain a crystalline structure of a plurality of metal atoms before sintering. Other semiconductor materials and metal materials may be used as the thermoelectric materials.

A plurality of conductor patterns 41 and 42 are formed on the front surface 10a of the insulating substrate 10. The plurality of conductor patterns 41 and 42 are formed by a conductor layer made of copper being patterned into a desired shape. The plurality of conductor patterns 41 and 42 may be made of a conductive material other than copper. The plurality of conductor patterns 41 and 42 have a thin, flat, plate shape. That is, the plurality of conductor patterns 41 and 42 extend along one surface. A single conductor pattern 41 or 42 is arranged to span both the first thermoelectric member 31 and the second thermoelectric member 32. Therefore, adjacent first thermoelectric member 31 and second thermoelectric member 32 are electrically connected by a single conductor pattern 41 or 42. As a result, the plurality of first thermoelectric members 31 and the plurality of second thermoelectric members 32 are such that the first thermoelectric member 31 and the second thermoelectric member 32 are alternately connected in series.

In this manner, the plurality of conductor patterns 41 and 42 configure two contact portions (that is, connection portions) of the first thermoelectric member 31 and the second thermoelectric member 32. Of the plurality of conductor patterns 41 and 42, the first conductor pattern 41 that connects the first thermoelectric member 31 and the second thermoelectric member 32 in this order, that is, in the order of PN according to the present embodiment in a voltage forward direction of thermal electromotive force configures a hot contact portion. Meanwhile, of the plurality of conductor patterns 41 and 42, the second conductor pattern 42 that connects the second thermoelectric member 32 and the first thermoelectric member 31 in this order in the voltage forward direction of thermal electromotive force configures a cold contact portion. The voltage forward direction of thermal electromotive force indicates an array orientation from a positive terminal side to a negative terminal side of generated voltage when the radiant heat sensor 101 receives radiant heat and generates a sensor output voltage. In addition, the contact portion that becomes a high-temperature side when the temperature difference occurs between the two contact portions of the first thermoelectric member 31 and the second thermoelectric member 31 is the hot contact portion, and the contact portion that becomes a low-temperature side is the cold contact portion.

Here, as shown in FIG. 2, on the front surface 10a of the insulating substrate 10, an array direction of the first and second thermoelectric members 31 and 32 is the first direction DR1. A direction orthogonal to the array direction of the first and second thermoelectric members 31 and 32 is the second direction DR2. At this time, a dimension of a single conductor pattern 41 or 42 in the second direction DR2 is identical to a dimension of the first and second thermoelectric member 31 and 32 in the second direction DR2. In addition, a dimension of a single conductor pattern 41 or 42 in the first direction DR1 is longer than the interval between an adjacent first thermoelectric member 31 and second thermoelectric member 32. Therefore, a single conductor pattern 41 or 42 has a predetermined area.

As shown in FIG. 3, in the structure in which the first thermoelectric member 31 and the second thermoelectric member 31 are alternately connected in series, a section that includes a single first conductor pattern 41 and a single second conductor pattern 42 configures a single unit, that is, a single thermoelectric conversion element UN1.

A heat-receiving plate 51 is formed on a front surface of the first conductor pattern 41. The heat-receiving plate 51 is in direct contact with the first conductor pattern 41. The heat-receiving plate 51 is a plate-shaped heat-receiving member that absorbs radiant heat and generates heat. A planar shape of the heat-receiving plate 51 is identical to that of the first conductor pattern 41. The heat-receiving plate 51 is configured by a member that is separate from the first conductor pattern 41.

In addition, a reflective plate 52 is formed on a front surface of the second conductor pattern 42. The reflective plate 52 is in direct contact with the second conductor pattern 42. The reflective plate 52 is a plate-shaped reflective member that reflects radiant heat. A planar shape of the reflective plate is identical to that of the second conductor pattern 42. The reflective plate 52 is configured by a member that is separate from the second conductor pattern 42.

The heat-receiving plate 51 according to the present embodiment is made of a material that has higher emissivity (that is, a higher absorption rate) of radiant heat within a wavelength range of visible light, compared to the first conductor pattern 41, so as to absorb radiant heat within the wavelength range of visible light. Specifically, the heat-receiving plate 51 is made of black copper oxide. In addition, the reflective plate 52 is made of a material that has lower emissivity (that is, higher reflectance) of radiant heat within the wavelength range of visible light, compared to the second conductor pattern 42, so as to reflect radiant heat within the wavelength range of visible light. Specifically, the reflective plate 52 is made of gold plating.

The front-surface protective member 20 is laminated onto the front surface 10a side of the insulating substrate 10. The front-surface protective member 20 is made of a thermoplastic resin that is a flexible material, in a manner similar to the insulating substrate 10. The front-surface protective member 20 covers the heat-receiving plate 51, the reflective plate 52, and the first and second thermoelectric members 31 and 32 that are exposed from the heat-receiving plate 51 and the reflective plate 52.

In addition, a back-surface conductor pattern 61 is formed on the back surface 10b of the insulating substrate 10. The back-surface conductor pattern 61 is made of a conductive material, that is, copper according to the present embodiment. The back-surface conductor pattern 61 is provided for the purpose of preventing detachment of the first and second thermoelectric members 31 and 32 from the insulating substrate 10 during manufacturing of the radiant heat sensor 101.

Next, a manufacturing method of the radiant heat sensor 101 according to the present embodiment will be described with reference to FIG. 4 by (a) to (f).

Figure 4:
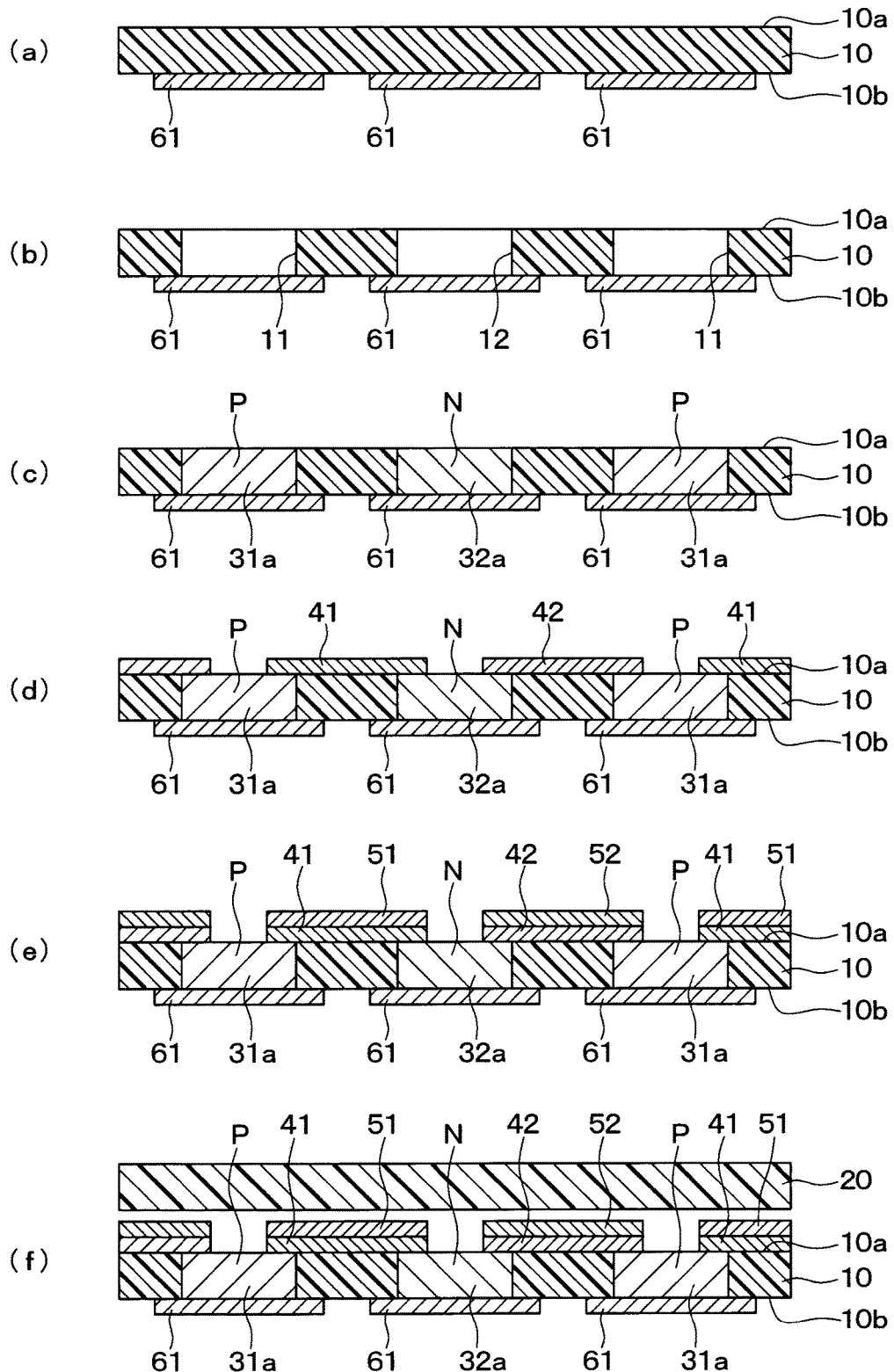
FIG. 4 is a cross-sectional view showing manufacturing steps of the radiant heat sensor according to the first embodiment.

First, as shown in FIG. 4 by (a), the insulating substrate 10 in which the back-surface conductor pattern 61 of a desired shape is formed on the back surface 10b is prepared. The back-surface conductor pattern 61 is formed by etching of a copper foil that is formed on the back surface 10b of the insulating substrate 10. As shown in FIG. 4 by (b), the back-surface conductor pattern 61 is formed in positions that oppose planned formation areas of the first and second via holes 11 and 12.

Next, as shown in FIG. 4 by (b), the plurality of first via holes 11 and the plurality of second via holes 12 are formed in the insulating substrate 10.

Next, as shown in FIG. 4 by (c), each of the plurality of first via holes 11 is filled with a first paste 31a that composes the first thermoelectric member 31. In a similar manner, each of the plurality of second via holes 12 is filled with a second paste 32a that composes the second thermoelectric member 32. The first paste 31a is that in which an organic solvent is added to a powder of a Bi—Sb—Te alloy in which metal atoms retain a predetermined crystalline structure, thereby forming a paste. The second paste 32a is that in which an organic solvent is added to a powder of a Bi—Te alloy in which metal atoms that differ from the metal atoms composing the first paste 31a retain a predetermined crystalline structure, thereby forming a paste.

Next, as shown in FIG. 4 by (d), copper is vapor-deposited onto the front surface 10a of the insulating substrate 10, and the first conductor patterns 41 and the second conductor patterns 42 are formed.

Next, as shown in FIG. 4 by (e), the heat-receiving plate 51 is formed on the front surface of the first conductor pattern 41. Specifically, an oxidation process is performed on the first conductor pattern 41 that is made of copper. As a result, the black heat-receiving plate 51 that is made of copper oxide is formed. In addition, the reflective plate 52 is formed on the front surface of the second conductor pattern 42. Specifically, electroless plating of gold is performed on the second conductor pattern 42 that is made of copper. As a result, the reflective plate 52 that is made of gold plating is formed.

Then, as shown in FIG. 4 by (f), the front-surface protective member 20 is prepared. The front-surface protective member 20 and the insulating substrate 10 to which the step shown in FIG. 4 by (e) has been performed are laminated, and a laminated body is thereby formed. Subsequently, the laminated body is heated and pressed. As a result, the front-surface protective member 20 and the insulating substrate 10 are integrated. Furthermore, as a result of heating at this time, the respective powders of the first paste 31a and the second paste 32a are sintered, thereby forming the first thermoelectric member 31 and the second thermoelectric member 32.

The radiant heat sensor configured as shown in FIGS. 2 and 3 is manufactured in this manner.

According to the present embodiment, the heat-receiving plate 51 is made of copper oxide. However, the heat-receiving plate 51 may also be made of another material that has high emissivity within the wavelength range of visible light. For example, the heat-receiving plate 51 may be made of a black paint coating. In addition, according to the present embodiment, the reflective plate 52 is made of gold plating. However, the reflective plate 52 may also be made of another material that has low emissivity within the wavelength range of visible light. For example, the reflective plate 52 may be made of shiny copper that has low surface roughness.

Furthermore, the materials composing the heat-receiving plate 51 and the reflective plate 52 may be selected based on the wavelength range of the radiant heat that is to be detected by the radiant heat sensor 101. In cases in which radiant heat in an infrared range is to be detected, the heat-receiving plate 51 may be made of a material that has high emissivity within the infrared range. The reflective plate 52 may be made of a material that has low emissivity within the infrared range. In this case, the heat-receiving plate 51 and the reflective plate 52 are formed by application of a coating, vapor deposition, or the like.

Figure 5:
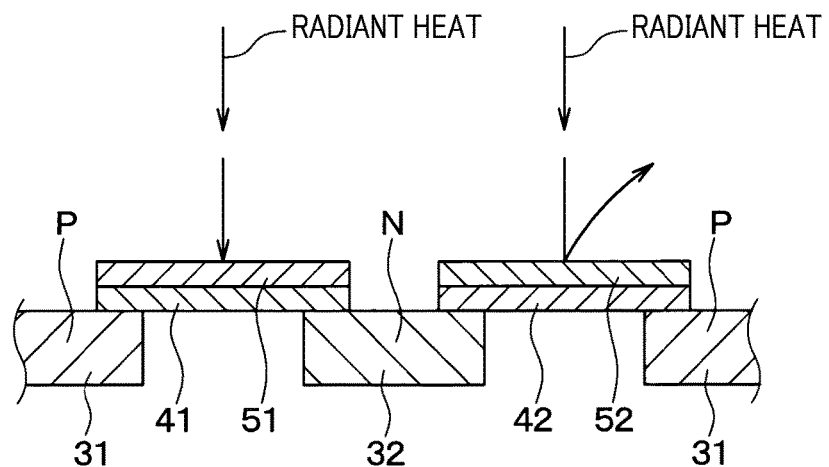
FIG. 5 is a cross-sectional view showing main sections of the radiant heat sensor according to the first embodiment.

Next, the measurement of heat quantity of radiant heat by the radiant heat measurement apparatus 100 according to the present embodiment will be described with reference to FIG. 5. FIG. 5 is a cross-sectional view of main sections of the radiant heat sensor 101 according to the present embodiment.

As shown in FIG. 5, when radiant heat within a wavelength range of visible light is irradiated onto the front surface 10a side of the radiant heat sensor 101 according to the present embodiment, the heat-receiving plate 51 absorbs the radiant heat. The reflective plate 52 reflects the radiant heat that is irradiated towards the second conductor pattern 42. The heat-receiving plate 51 generates heat as a result of absorbing the radiant heat. Because the absorbed quantity of radiant heat of the reflective plate 52 is less than that of the heat-receiving plate 51, the generated quantity of heat of the reflective plate 52 is less than that of the heat-receiving plate 51. Therefore, a temperature difference occurs between the heat-receiving plate 51 and the reflective plate 52.

At this time, the first conductor pattern 41 receives heat due to the radiant heat from the heat-receiving plate 51. In addition, the second conductor pattern 42 receives heat due to the radiant heat from the reflective plate 52. Therefore, a temperature difference occurs between the first conductor pattern 41 and the second conductor pattern 42. The thermoelectric conversion element UN1 generates a thermal electromotive force, that is, electrical output based on the temperature difference between the first conductor pattern 41 and the second conductor pattern 42. The electrical output is a voltage. The electrical output may also be an electric current.

Then, the calculating unit 102 shown in FIG. 1 calculates heat flux of the radiant heat based on an output value (specifically, a voltage value) outputted from the radiant heat sensor 101, and a relationship between the output value and the heat flux that is stored in advance. The calculating unit 102 outputs the calculation result to the display unit 103 shown in FIG. 1. As a result, the heat flux ($W/m^2$) calculated by the calculating unit 102 is displayed in the display unit 103.

The radiant heat measurement apparatus 100 according to the present embodiment can measure the heat quantity of radiant heat in this manner.

Figure 6:
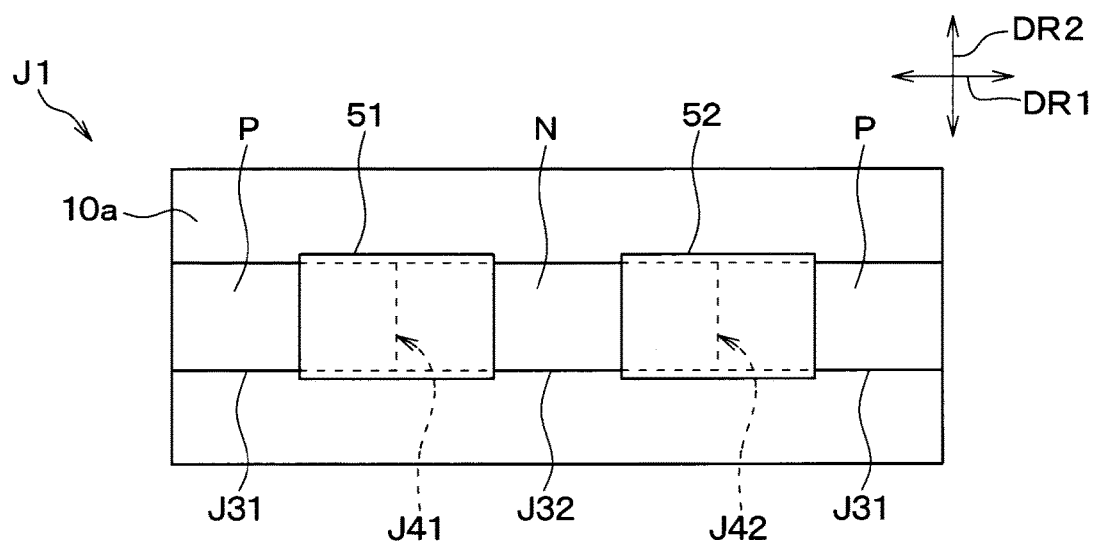
FIG. 6 is a plan view of a radiant heat sensor of a consideration example.

Next, the radiant heat sensor 101 according to the present embodiment and the radiant heat sensor J1 of the consideration example shown in FIG. 6 will be compared. FIG. 6 corresponds to FIG. 2. The radiant heat sensor J1 of the consideration example differs from the radiant heat sensor 101 according to the present embodiment in that the first thermoelectric member J31 and the second thermoelectric member J32 are connected in direct contact, and the conductor patterns 41 and 42 that connect the first thermoelectric member J31 and the second thermoelectric member J32 are not provided. The first thermoelectric member J31 and the second thermoelectric member J32 are respectively made of the same materials as the first thermoelectric member 31 and the second thermoelectric member 32 according to the present embodiment. Other configurations of the radiant heat sensor J1 of the consideration example are identical to those of the radiant heat sensor 101 according to the present embodiment.

As shown in FIG. 6, in the radiant heat sensor J1 of the consideration example, on the front surface 10a of the insulating substrate 10, the hot contact portion J41 and the cold contact portion J42 of the first thermoelectric member J31 and the second thermoelectric member J32 are both linearly shaped areas. Therefore, because the heat-receiving areas of the hot contact portion J41 and the cold contact portion J42 for respectively receiving heat from the heat-receiving plate 51 and the reflective plate 52 are small, thermal energy that is transmitted to the hot contact portion J41 and the cold contact portion J42 becomes small. Consequently, the respective temperatures of the hot contact portion J41 and the cold contact portion J42 deviate from the respective temperatures of the heat-receiving plate 51 and the reflective plate 52.

Therefore, the electrical output of the thermoelectric conversion element UN when radiant heat is incident on the surface of the radiant heat sensor J1 of the consideration example becomes small. As a result, in the radiant heat sensor J1 of the consideration example, detection sensitivity when the heat quantity of radiant heat is detected as electrical output becomes low.

In this regard, in the radiant heat sensor 101 according to the present embodiment, the hot contact portion is configured by the first conductor pattern 41 and the cold contact portion is configured by the second conductor pattern 42, as described above. Therefore, as a result of the radiant heat sensor 101 according to the present embodiment, the respective heat-receiving areas of the hot contact portion and the cold contact portion can be made larger than those of the radiant heat sensor J1 of the consideration example. For example, as shown in FIG. 2 and FIG. 6, in the radiant heat sensor 101 according to the present embodiment and the radiant heat sensor J1 of the consideration example, when the respective dimensions in the second direction DR2 of the first thermoelectric components 31 and J31 and the second thermoelectric components 32 and J32 are the same, the respective heat-receiving areas of the hot contact portion 41 and the cold contact portion 42 of the radiant heat sensor 101 according to the present embodiment are larger than those of the radiant heat sensor J1 of the consideration example.

Therefore, when the heat quantity of radiant heat that is irradiated is the same, the respective temperatures of the hot contact portion 41 and the cold contact portion 42 can be made closer to the respective temperatures of the heat-receiving plate 51 and the reflective plate 52 in the radiant heat sensor 101 according to the present embodiment, compared to those of the radiant heat sensor J1 of the consideration example. The temperature difference between the hot contact portion 41 and the cold contact portion 42 can be made larger.

Consequently, as a result of the radiant heat sensor 101 according to the present embodiment, the electrical output of the thermoelectric conversion element UN1 when radiant heat is irradiated onto the front surface 101a can be increased compared to that of the radiant heat sensor J1 of the consideration example, and the detection sensitivity of the radiant heat sensor 101 can be improved.

The radiant heat sensor 101 according to the present embodiment includes the front-surface protective member 20. However, the front-surface protective member 20 may not be provided. In this case, for example, the radiant heat sensor 101 is manufactured by a heating step of sintering the respective powders of the first paste 31a and the second paste 32a being performed in place of the step shown in FIG. 4 by (f). This similarly applies to radiant heat sensors 101 according to embodiments described hereafter that include the front-surface protective member 20 on an outermost surface.

Second Embodiment

According to the present embodiment, the structure of the radiant heat sensor 101 is modified in relation to that according to the first embodiment.

Figure 7:
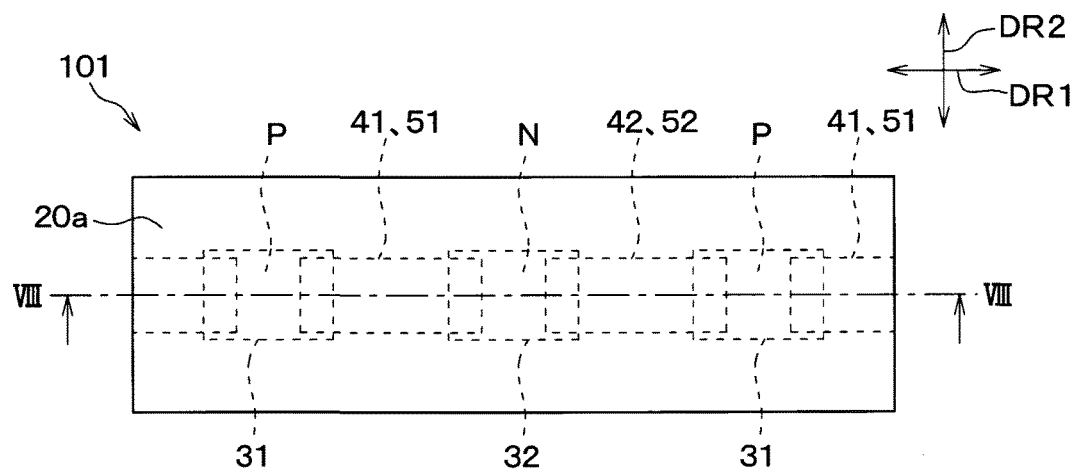
FIG. 7 is a plan view of a radiant heat sensor according to a second embodiment.
Figure 8:
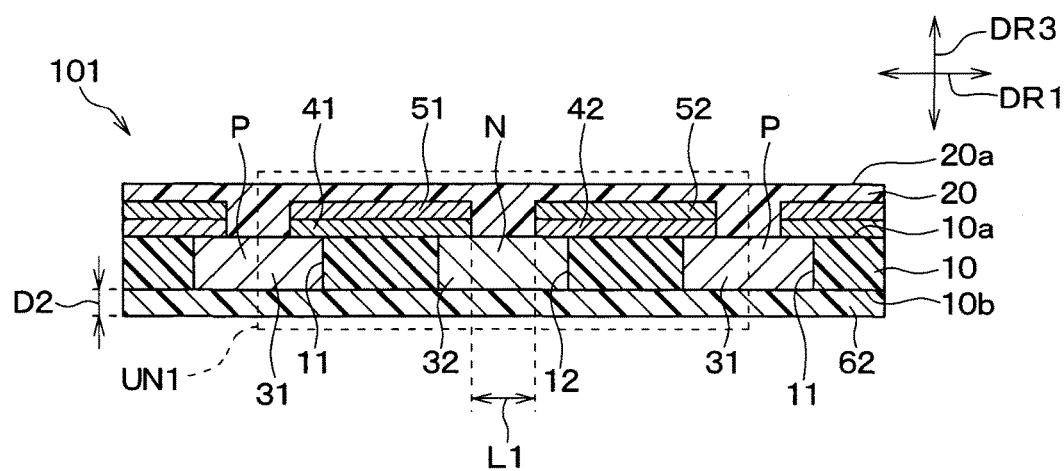
FIG. 8 is a cross-sectional view taken along line VIII-VIII in FIG. 7.

As shown in FIGS. 7 and 8, the radiant heat sensor 101 according to the present embodiment includes a back-surface protective member 62 in place of the back-surface conductor pattern 61 of the radiant heat sensor 101 according to the first embodiment.

The back-surface protective member 62 is an insulating layer that is laminated onto the back surface 10b side of the insulating substrate 10. Therefore, the radiant heat sensor 101 according to the present embodiment has a three-layer structure in which three insulating layers 10, 20, and 62 are laminated. The back-surface protective member 62 corresponds to a second insulating layer.

The back-surface protective member 62 is made of a thermoplastic resin that is a flexible material, in a manner similar to the insulating substrate 10. The back-surface protective member 62 covers the first and second thermoelectric members 31 and 32. In the radiant heat sensor 101 according to the present embodiment as well, effects similar to those according to the first embodiment are achieved.

In addition, according to the present embodiment, a thickness dimension D2 of the back-surface protective member 62 is set to be smaller than an interval L1 between adjacent first conductor pattern 41 and second conductor pattern 42.

Here, in cases in which the back-surface protective member 62 is provided, when heat transfer in the first direction DR1 occurs within the back-surface protective member 62, the temperature difference between the first conductor pattern 41 and the second conductor pattern 42 decreases.

In this regard, according to the present embodiment, as a result of the thickness dimension in the third direction DR3 of the back-surface protective member 62 being reduced, heat transfer in the third direction DR3 is facilitated within the back-surface protective member 62. As a result, the heat received by the first conductor pattern 41 can be moved in the third direction DR3 within the back-surface protective member 62 and released outside of the back-surface protective member 62. Consequently, decrease in the temperature difference between the first conductor pattern 41 and the second conductor pattern 42 can be suppressed. The detection sensitivity of the radiant heat sensor 101 can be improved.

Third Embodiment

According to the present embodiment, the structure of the radiant heat sensor 101 is modified in relation to that according to the first embodiment.

Figure 9:
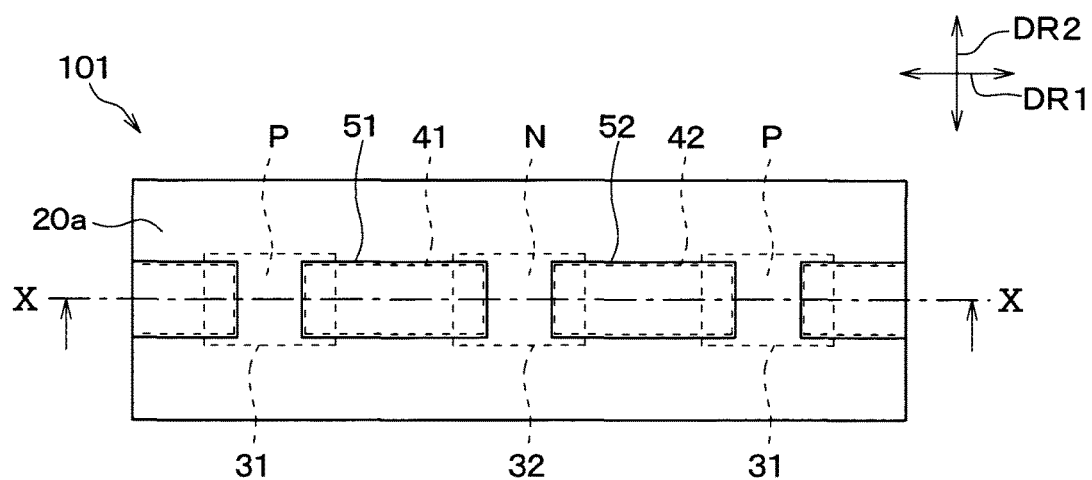
FIG. 9 is a plan view of a radiant heat sensor according to a third embodiment.
Figure 10:
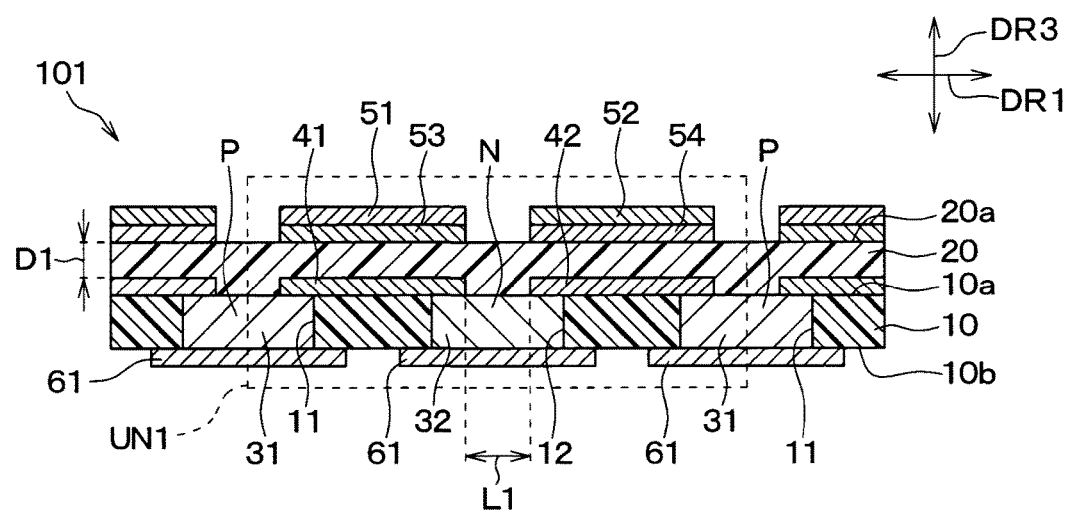
FIG. 10 is a cross-sectional view taken along line X-X in FIG. 9.

As shown in FIGS. 9 and 10, the radiant heat sensor 101 according to the present embodiment differs from the radiant heat sensor 101 according to the first embodiment in that the heat-receiving plate 51 and the reflective plate 52 are formed on the front surface 20a of the front-surface protective member 20. The front-surface protective member 20 corresponds to a first insulating layer.

The heat-receiving plate 51 is formed in an area of the front surface 20a of the front-surface protective member 20 that opposes the first conductor pattern 41 in the third direction DR3. The heat-receiving plate 51 is formed on a front surface of a base conductor pattern 53.

The heat-receiving plate 51 has the same shape and size as the first conductor pattern 41. The placement, shape, and size of the heat-receiving plate 51 may be changed as long as the heat generated as a result of absorption of radiant heat can be transmitted to the first conductor pattern 41. The size of the heat-receiving plate 51 may be made smaller or larger than the first conductor pattern 41. At least a portion of the heat-receiving plate 51 may be positioned within the area of the front surface of the front-surface protective member 20 that opposes the first conductor pattern 41.

In a similar manner, the reflective plate 52 is formed in an area of the front surface of the front-surface protective member 20 that opposes the second conductor pattern 42 in the third direction DR3. The reflective plate 52 is formed on a front surface of a base conductor pattern 54.

The reflective plate 52 has the same shape and size as the second conductor pattern 42. The placement, shape, and size of the reflective plate 52 may be changed as long as the heat received by the second conductor pattern 42 is less than that of the first conductor pattern 41. The size of the reflective plate 52 may be made smaller or larger than the second conductor pattern 42. All that is required is that at least a portion of the reflective plate 52 is positioned within the area of the front surface of the front-surface protective member 20 that opposes the second conductor pattern 42.

Next, a manufacturing method of the radiant heat sensor 101 according to the present embodiment will be described with reference to FIG. 11 by (a) to (f). The steps shown in FIG. 11 by (a), (b), and (c) are respectively identical to the steps shown in FIG. 4 by (a), (b), and (c), described according to the first embodiment.

Figure 11:
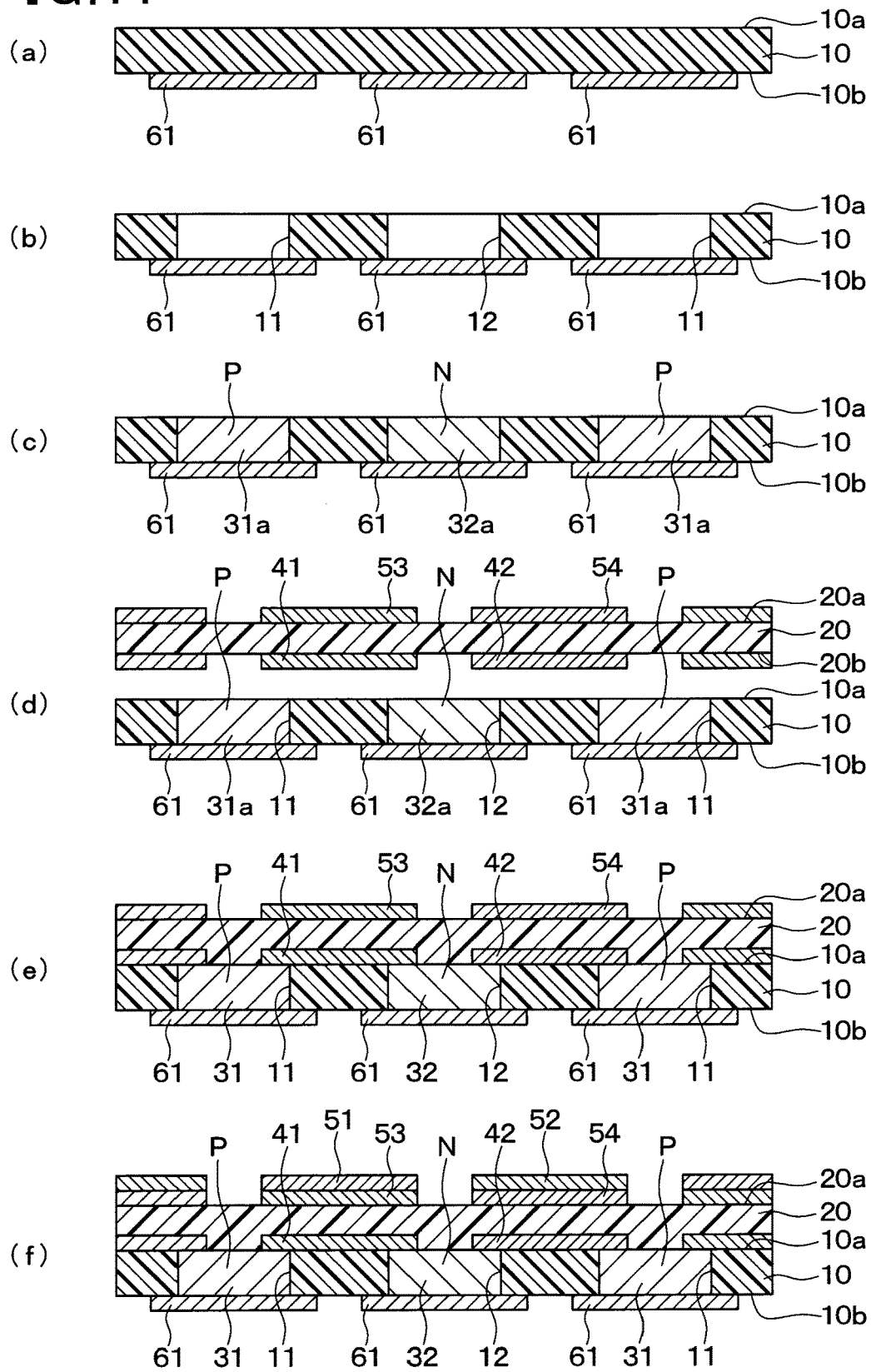
FIG. 11 is a cross-sectional view of manufacturing steps of the radiant heat sensor according to the third embodiment.

According to the present embodiment, as shown in FIG. 11 by (d), the front-surface protective member 20 and the insulating substrate 10 are prepared. The front-surface protective member 20 and the insulating substrate 10 are laminated, and a laminated body is thereby formed. The front-surface protective member 20 that is prepared at this time is that in which conductor patterns of desired shapes are formed on both surfaces 20a and 20b. The conductor patterns formed on both surfaces are the first and second conductor patterns 41 and 42, and the base conductor patterns 53 and 54 that serve as foundations for the heat-receiving plate 51 and the reflective plate 52. The insulating substrate 10 that is prepared is that which has undergone the step shown in FIG. 11 by (c).

Next, as shown in FIG. 11 by (e), the laminated body is heated and pressed. As a result, the front-surface protective member 20 and the insulating substrate 10 are integrated. In addition, the first thermoelectric member 31 and the second thermoelectric member 32 are formed by the heating performed at this time.

Then, as shown in FIG. 11 by (f), the heat-receiving plate 51 is formed on the front surface of the base conductor pattern 53. Specifically, an oxidation process is performed on the base conductor pattern 53 that is made of copper. As a result, the black heat-receiving plate 51 that is made of copper oxide is formed. In addition, the reflective plate 52 is formed on the front surface of the base conductor pattern 54. Specifically, electroless plating of gold is performed on the base conductor pattern 54 that is made of copper. As a result, the reflective plate 52 that is made of gold plating is formed.

The radiant heat sensor 101 according to the present embodiment is manufactured in this manner. In the radiant heat sensor 101 according to the present embodiment as well, effects similar to those according to the first embodiment are achieved.

Here, when the heat-receiving plate 51 and the reflective plate 52 are covered by the front-surface protective member 20, the front-surface protective member 20 is affected by the heat that is generated as a result of absorption of radiant heat. The temperature of the reflective plate 52 increases. Therefore, the temperature difference between the heat-receiving plate 51 and the reflective plate 52 decreases.

In this regard, according to the present embodiment, the heat-receiving plate 51 and the reflective plate 52 are exposed from the front-surface protective member 20. Therefore, compared to cases in which the heat-receiving plate 51 and the reflective plate 52 are covered by the front-surface protective member 20, the temperature difference between the heat-receiving plate 51 and the reflective plate 52 can be increased. Consequently, according to the present embodiment, the detection sensitivity of the radiant heat sensor 101 can be improved.

Furthermore, according to the present embodiment, a thickness dimension D1 of the front-surface protective member 20 between the heat-receiving plate 51 and the first conductor pattern 41 is set to be smaller than the interval L1 between adjacent first conductor pattern 41 and second conductor pattern 42. The thickness of the front-surface protective member 20 between the reflective plate 52 and the second conductor pattern 42 is the same as the thickness of the front-surface protective member 20 between the heat-receiving plate 51 and the first conductor pattern 41.

Here, when the front-surface protective member 20 is thick, heat transmission time from the heat-receiving plate 51 to the first conductor pattern 41 becomes long. In addition, when heat transfer occurs in the array direction DR1 of the first conductor pattern 41 and the second conductor pattern DR2 within the front-surface protective member 20, the temperature difference between the first conductor pattern 41 and the second conductor pattern 42 decreases.

In this regard, according to the present embodiment, because the thickness dimension D1 of the front-surface protective member 20 is small, heat transfer in the third direction DR3 is facilitated within the front-surface protective member 20. As a result, the heat transmission time from the heat-receiving plate 51 to the first conductor pattern 41 can be shortened. Responsiveness of the radiant heat sensor 101 can be improved. In addition, decrease in the temperature difference between the first conductor pattern 41 and the second conductor pattern 42 can be suppressed. The detection sensitivity of the radiant heat sensor 101 can be improved.

Fourth Embodiment

According to the present embodiment, the structure of the radiant heat sensor 101 is modified in relation to that according to the first embodiment.

Figure 12:
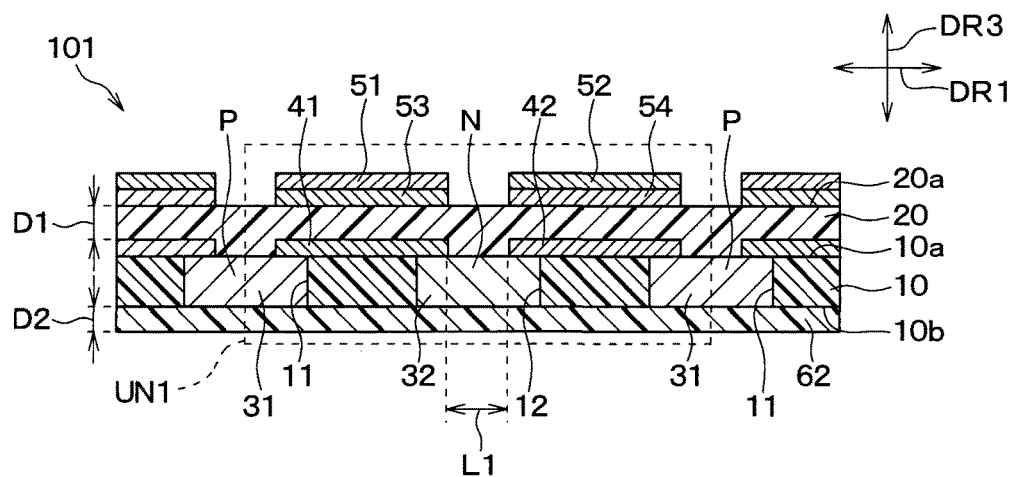
FIG. 12 is a cross-sectional view of a radiant heat sensor according to a fourth embodiment.

As shown in FIG. 12, in the radiant heat sensor 101 according to the present embodiment, the heat-receiving plate 51 and the reflective plate 52 are formed on the front surface 20a of the front-surface protective member 20 in a manner similar to that according to the third embodiment. According to the present embodiment as well, the thickness dimension D1 of the front-surface protective member 20 is set to be small. Consequently, in a manner similar to that according to the third embodiment, the responsiveness of the radiant heat sensor 101 can be improved. In addition, the detection sensitivity of the radiant heat sensor 101 can be improved.

Furthermore, the radiant heat sensor 101 according to the present embodiment includes the back-surface protective member 62 in a manner similar to that according to the second embodiment. According to the present embodiment as well, the thickness dimension D2 of the back-surface protective member 62 is set to be small. As a result of this configuration as well, the detection sensitivity of the radiant heat sensor 101 can be improved in a manner similar to that according to the second embodiment.

Fifth Embodiment

Figure 13:
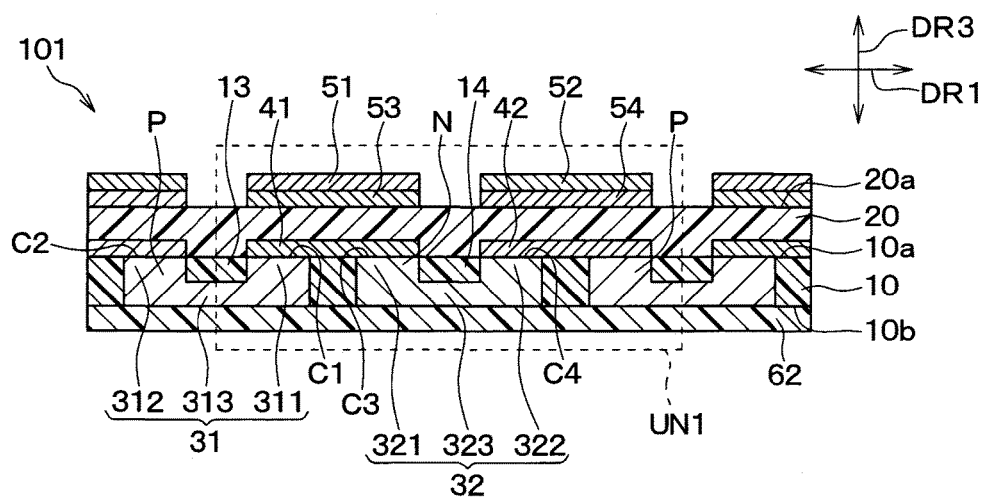
FIG. 13 is a cross-sectional view of a radiant heat sensor according to a fifth embodiment.

According to the present embodiment, the structure of the radiant heat sensor 101 is modified in relation to that according to the first embodiment. As shown in FIG. 13, the radiant heat sensor 101 according to the present embodiment differs from the radiant heat sensor 101 according to the first embodiment in that respective cross-sectional shapes of the first thermoelectric member 31 and the second thermoelectric member 32 are U-shaped. Other configurations of the radiant heat sensor 101 according to the present embodiment are identical to those of the radiant heat sensor 101 according to the fourth embodiment.

Specifically, the first thermoelectric member 31 is shaped to have a first extending portion 311, a second extending portion 312, and a first coupling portion 313. The first extending portion 311, the second extending portion 312, and the first coupling portion 313 are made of a same first thermoelectric material. The first extending portion 311 is a portion that extends from a first contacting end portion C1 that is in contact with the first conductor pattern 41 towards the back surface 10b side of the insulating substrate 10. The second extending portion 312 is a portion that extends from a second contacting end portion C2 that is in contact with the second conductor pattern 42 towards the back surface 10b of the insulating substrate 10. The first coupling portion 313 is a portion that is positioned to span from a section of the first extending portion 311 on the back surface 10b side of the insulating substrate 10 to a section of the second extending portion 312 on the back surface 10b side of the insulating substrate 10, so as to couple the first extending portion 311 and the second extending portion 312.

In addition, a portion 13 of the insulating substrate 10 is present between the first extending portion 311 and the second extending portion 312.

The second thermoelectric member 32 is shaped to have a third extending portion 321, a fourth extending portion 322, and a second coupling portion 323. The third extending portion 321, the fourth extending portion 322, and the second coupling portion 323 are made of a same second thermoelectric material. The third extending portion 321, the fourth extending portion 322, and the second coupling portion 323 respectively correspond to the first extending portion 311, the second extending portion 312, and the first coupling portion 313. The third extending portion 321 extends from a third contacting end portion C3 that is in contact with the first conductor pattern 41. The fourth extending portion 322 extends from a fourth contacting end portion C4 that is in contact with the second conductor pattern 42.

In the second thermoelectric member 32 as well, a portion 14 of the insulating substrate 10 is present between the third extending portion 321 and the fourth extending portion 322.

Next, a manufacturing method of the radiant heat sensor 101 according to the present embodiment will be described with reference to FIG. 14 by (a) to (c), FIG. 15 by (a) to (c), and FIG. 16 by (a) to (c).

Figure 14:
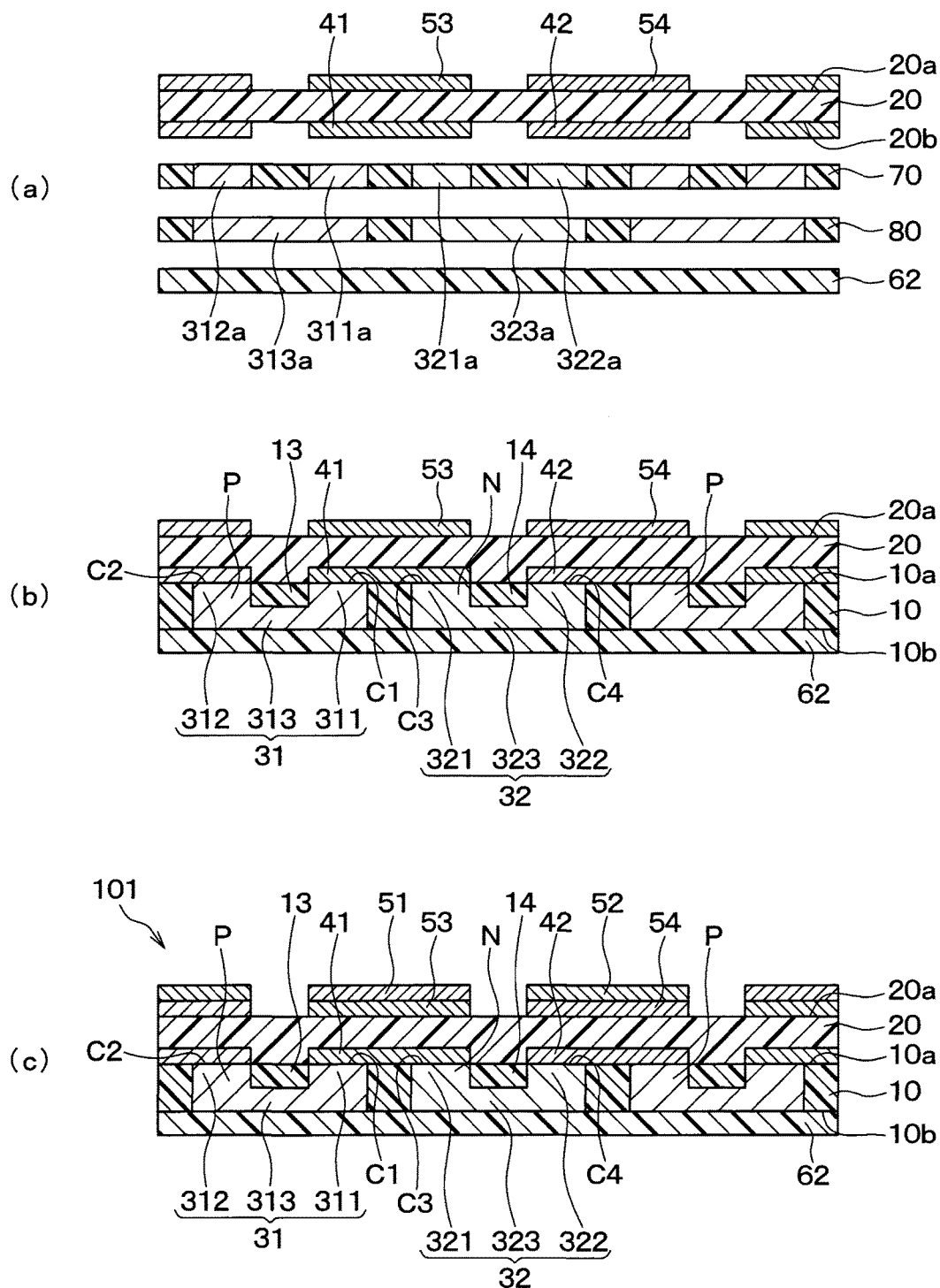
FIG. 14 is a cross-sectional view of manufacturing steps of the radiant heat sensor according to the fifth embodiment.

As shown in FIG. 14 by (a), the front-surface protective member 20, a first insulating substrate 70, a second insulating substrate 80, and the back-surface protective member 62 are prepared. A laminated body in which the front-surface protective member 20, the first insulating substrate 70, the second insulating substrate 80, and the back-surface protective member 62 are laminated is formed.

Conductor patterns of desired shapes are formed on both surfaces 20a and 20b of the front-surface protective member 20 that is prepared. Specifically, the first conductor pattern 41 and the second conductor pattern 42 are formed on the back surface 20b of the front-surface protective member 20. The base conductor patterns 53 and 54 are formed on the front surface 20a of the front-surface protective member 20.

Figure 15:
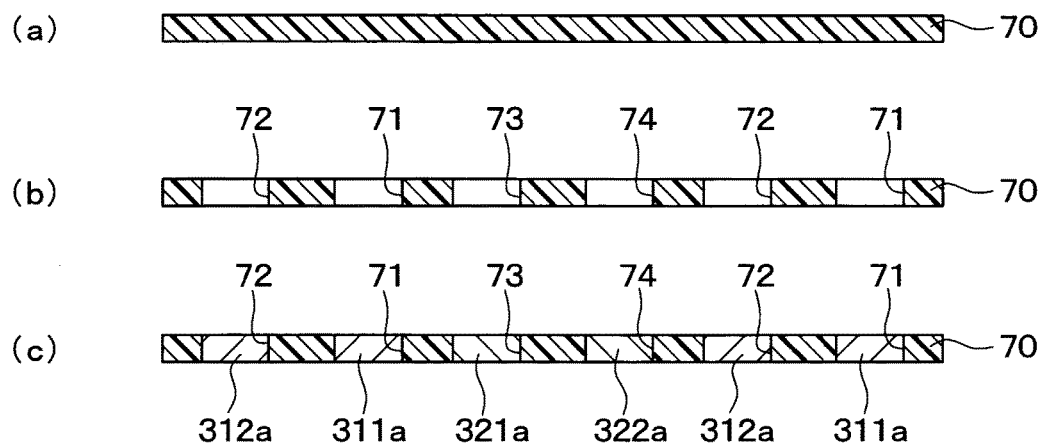
FIG. 15 is a cross-sectional view of manufacturing steps of the radiant heat sensor according to the fifth embodiment.

The first insulating substrate 70 that is prepared is that which has undergone the steps shown in FIG. 15 by (a) to (c). That is, as shown in FIG. 15 by (a), the first insulating substrate 70 is prepared. Next, as shown in FIG. 15 by (b), via holes 71, 72, 73, and 74 are formed in the first insulating substrate 70. The via holes 71 and 72 are respectively through holes for forming the first extending portion 311 and the second extending portion 312. The via holes 73 and 74 are respectively through holes for forming the third extending portion 321 and the fourth extending portion 322. Next, as shown in FIG. 15 by (c), the via holes 71 and 72 are filled with first pastes 311a and 312a that compose the first thermoelectric member 31. In a similar manner, the via holes 73 and 74 are filled with second pastes 321a and 322a that compose the second thermoelectric member 32.

Figure 16:
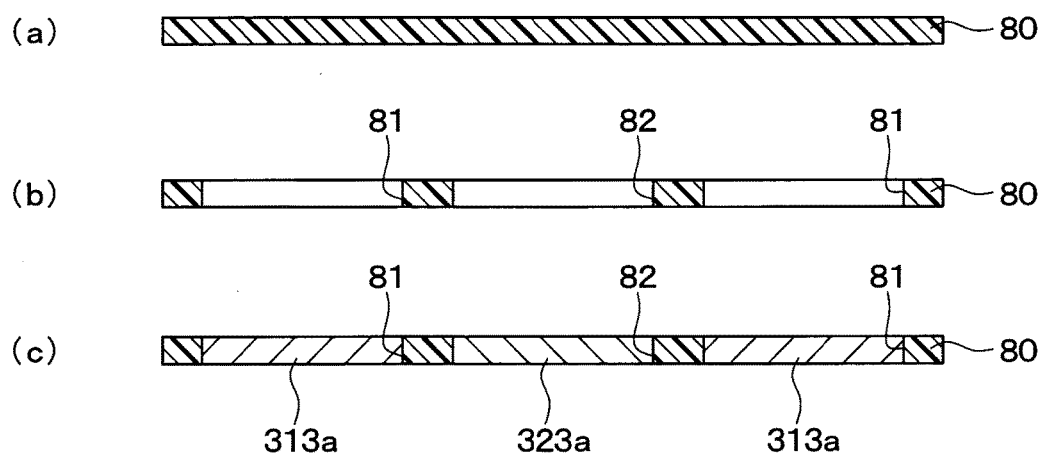
FIG. 16 is a cross-sectional view of manufacturing steps of the radiant heat sensor according to the fifth embodiment.

The second insulating substrate 80 that is prepared is that which has undergone the steps shown in FIG. 16 by (a) to (c). That is, as shown in FIG. 16 by (a), the second insulating substrate 80 is prepared. Next, as shown in FIG. 16 by (b), via holes 81 and 82 are formed in the second insulating substrate 80. The via hole 81 is a through hole for forming the first coupling portion 313. The via hole 82 is a through hole for forming the second coupling portion 323. Next, as shown in FIG. 16 by (c), the via hole 81 is filled with a first paste 313a that composes the first thermoelectric member 31. In a similar manner, the via hole 82 is filled with a second paste 323a that composes the second thermoelectric member 32.

Next, as shown in FIG. 14 by (b), the laminated body is heated and pressed. As a result, the front-surface protective member 20, the first insulating substrate 70, the second insulating substrate 80, and the back-surface protective member 62 are integrated. The insulating substrate 10 is formed as a result of the first insulating substrate 70 and the second insulating substrate 80 being integrated. In addition, the first thermoelectric member 31 and the second thermoelectric member 32 are formed by the heating that is performed at this time.

Then, as shown in FIG. 14 by (c), the heat-receiving plate 51 is formed on the front surface of the base conductor pattern 53. In addition, the reflective plate 52 is formed on the front surface of the base conductor pattern 54.

The radiant heat sensor 101 according to the present embodiment is manufactured in this manner.

As described above, according to the present embodiment, the portion 13 of the insulating substrate 10 is present between the first extending portion 311 and the second extending portion 312 in the first thermoelectric member 31. The insulating substrate 10 is a member that has lower heat conductance than the first thermoelectric material. That is, the insulating substrate 10 is a heat insulating member in which heat transfer is suppressed.

Therefore, a heat transmission path from the first contacting end portion C1 to the second contacting end portion C2 in the first thermoelectric member 31 is a path that reaches the second extending portion 312 from the first extending portion 311, via the first coupling portion 313.

Therefore, according to the present embodiment, compared to cases in which the cross-sectional shape of the first thermoelectric member 31 is not U-shaped, a heat transfer distance when heat moves within the first thermoelectric member 31 from the first conductor pattern 41 to the second conductor pattern 42 can be increased. Consequently, decrease in the temperature difference between the first conductor pattern 41 and the second conductor pattern 42 resulting from heat transfer within the first thermoelectric member 31 can be suppressed.

The portion 14 of the insulating substrate 10 is present between the third extending portion 321 and the fourth extending portion 322 in the second thermoelectric member 32 as well.

Therefore, in the second thermoelectric member 32 as well, compared to cases in which the cross-sectional shape of the second thermoelectric member 32 is not U-shaped, a heat transfer distance when heat moves within the second thermoelectric member 32 from the third contacting end portion C3 to the fourth contacting end portion C4 can be increased. Consequently, decrease in the temperature difference between the first conductor pattern 41 and the second conductor pattern 42 resulting from heat transfer within the second thermoelectric member 32 can be suppressed.

As a result, according to the present embodiment, the detection sensitivity of the radiant heat sensor 101 can be improved.

Sixth Embodiment

Figure 17:
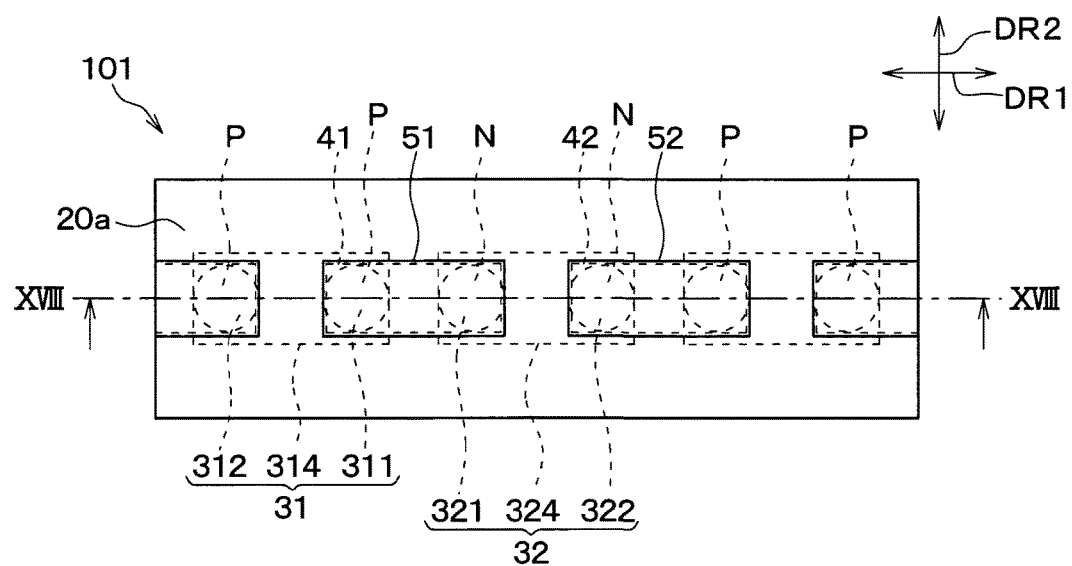
FIG. 17 is a plan view of a radiant heat sensor according to a sixth embodiment.
Figure 18:
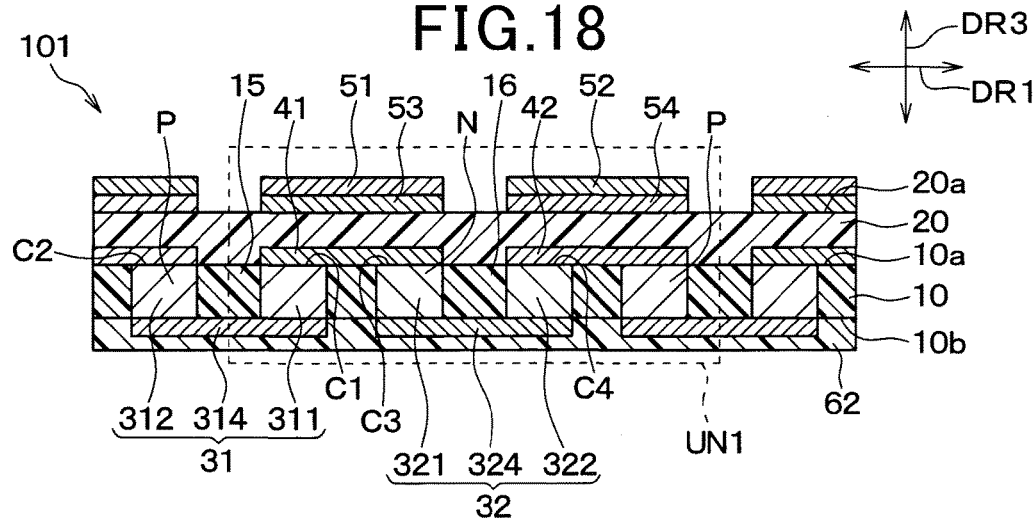
FIG. 18 is a cross-sectional view taken along line XVIII-XVIII in FIG. 17.
Figure 19:
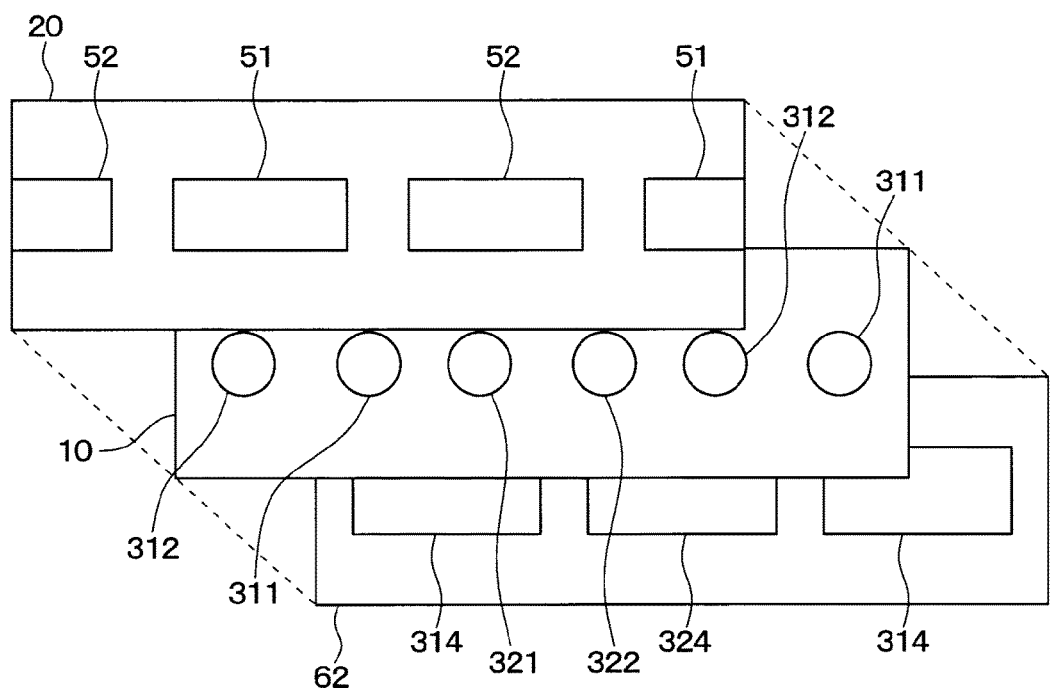
FIG. 19 is a plan view of each layer in FIG. 17.

According to the present embodiment, the structure of the radiant heat sensor 101 is modified in relation to that according to the first embodiment. As shown in FIGS. 17, 18, and 19, the radiant heat sensor 101 according to the present embodiment differs from the radiant heat sensor 101 according to the first embodiment regarding the structures of the first thermoelectric member 31 and the second thermoelectric member 32. Other configurations are identical to those of the radiant heat sensor 101 according to the fourth embodiment.

Specifically, the first thermoelectric member 31 is structured to have the first extending portion 311, the second extending portion 312, and a first wiring pattern 314. The first extending portion 311 and the second extending portion 312 are made of the same first thermoelectric material. The first wiring pattern 314 is a conductor pattern that is made of a conductor, such as copper foil, that differs from the first thermoelectric material.

The first extending portion 311 is a portion that extends from the first contacting end portion C1 to the back surface 10b of the insulating substrate 10. The second extending portion 312 is a portion that extends from the second contacting end portion C2 to the back surface 10b of the insulating substrate 10. The first wiring pattern 314 is arranged so as to span both the first extending portion 311 and the second extending portion 312 on the back surface 10b of the insulating substrate 10. As a result, the first wiring pattern 314 connects the first extending portion 311 and the second extending portion 312.

As shown in FIG. 19, planar shapes of the first extending portion 311 and the second extending portion 312 are circles. A planar shape of the first wiring pattern 314 is a rectangle. Planar shapes of the first conductor pattern 41 and the heat-receiving plate 51 are rectangles.

In this manner, when the first extending portion 311 and the second extending portion 312 are connected by the first wiring pattern 314, and the first wiring pattern 314 is in a state in which a temperature difference is not present in the planar direction thereof, the first extending portion 311, the second extending portion 312, and the first wiring pattern 314 can be considered to be a single thermoelectric member.

In addition, a portion 15 of the insulating substrate 10 is present between the first extending portion 311 and the second extending portion 312.

The second thermoelectric member 32 is structured to have the third extending portion 321, the fourth extending portion 322, and a second wiring pattern 324. The third extending portion 321 and the fourth extending portion 322 are made of the same second thermoelectric material. The second wiring pattern 324 is made of a conductor, such as copper foil, that differs from the second thermoelectric material. The third extending portion 321, the fourth extending portion 322, and the second wiring pattern 324 respectively correspond to the first extending portion 311, the second extending portion 312, and the first wiring pattern 314. The third extending portion 321 extends from the third contacting end portion C3. The fourth extending portion 322 extends from the fourth contacting end portion C4.

In addition, in the second thermoelectric member 32 as well, a portion 16 of the insulating substrate 10 is present between the third extending portion 321 and the fourth extending portion 322.

Next, a manufacturing method of the radiant heat sensor 101 according to the present embodiment will be described with reference to FIG. 20 by (a) to (c) and FIG. 21 by (a) to (c).

Figure 20:
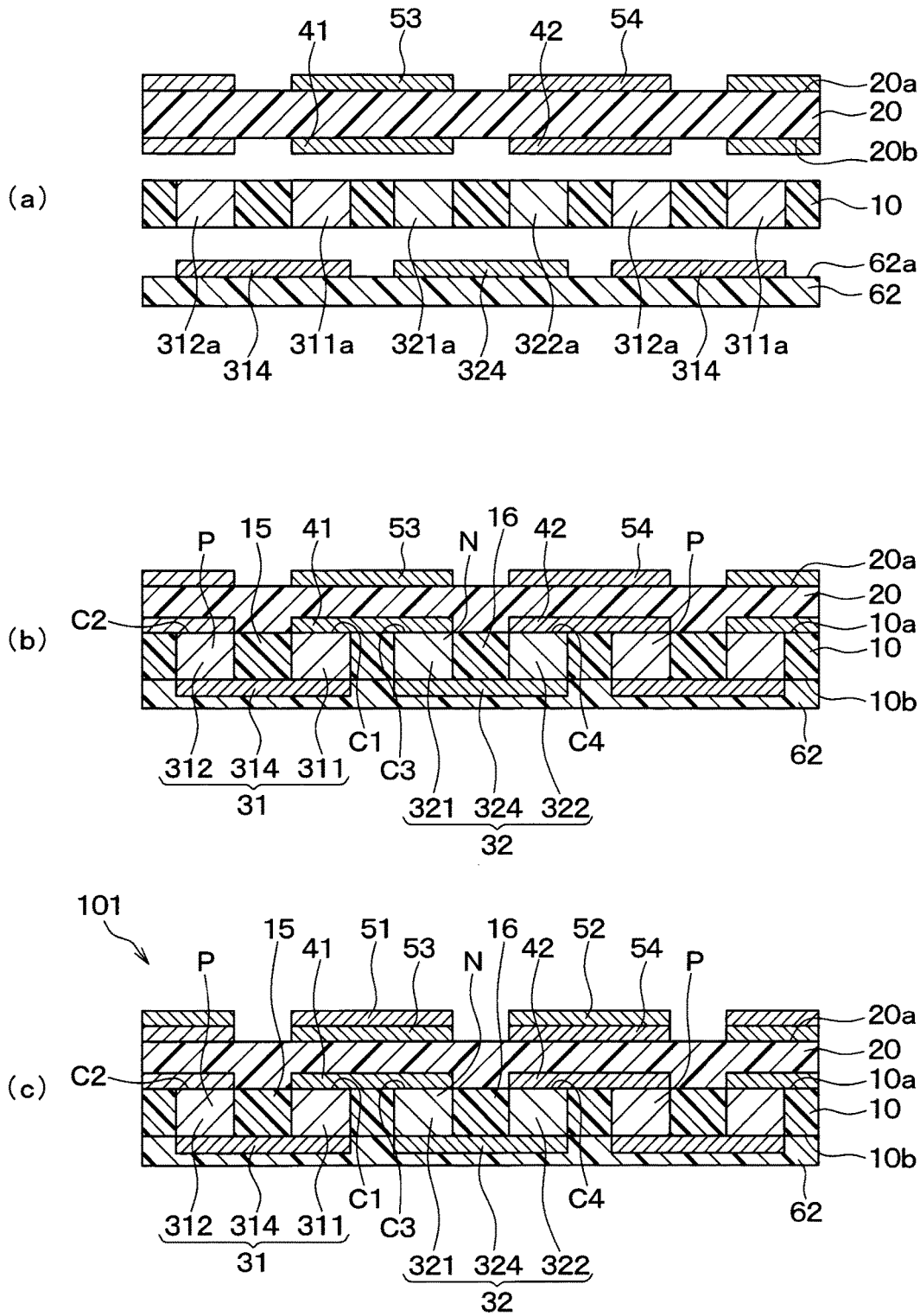
FIG. 20 is a cross-sectional view of manufacturing steps of the radiant heat sensor according to the sixth embodiment.

As shown in FIG. 20 by (a), the front-surface protective member 20, the insulating substrate 10, and the back-surface protective member 62 are prepared. A laminated body in which the front-surface protective member 20, the insulating substrate 10, and the back-surface protective member 62 are laminated is formed.

Conductor patterns of desired shapes are formed on both surfaces 20a and 20b of the front-surface protective member 20 that is prepared. Specifically, the first conductor pattern 41 and the second conductor pattern 42 are formed on the back surface 20b of the front-surface protective member 20. The base conductor patterns 53 and 54 are formed on the front surface 20a of the front-surface protective member 20.

Figure 21:
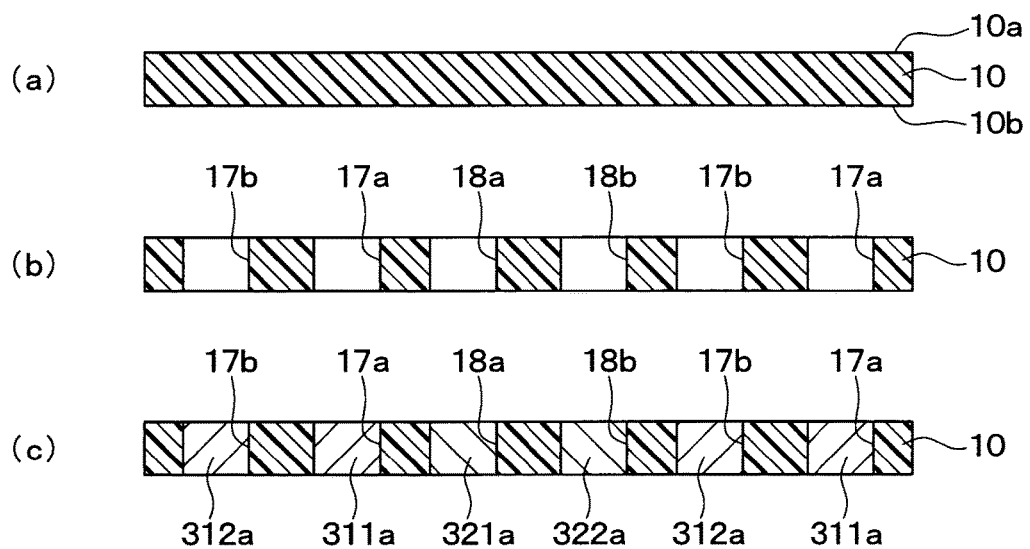
FIG. 21 is a cross-sectional view of manufacturing steps of the radiant heat sensor according to the sixth embodiment.

The insulating substrate 10 that is prepared is that which has undergone the steps shown in FIG. 21 by (a) to (c). That is, the insulating substrate 10 is prepared as shown in FIG. 21 by (a). Next, as shown in FIG. 21 by (b), via holes 17a, 17b, 18a, and 18b are formed in the insulating substrate 10. The via holes 17a and 17b are through holes for forming the first extending portion 311 and the second extending portion 312. The via holes 18a and 18b are through holes for forming the third extending portion 321 and the fourth extending portion 322. Next, as shown in FIG. 21 by (c), the via holes 17a and 17b are filled with the first pastes 311a and 312a that compose the first thermoelectric member 31. In a similar manner, the via holes 18a and 18b are filled with the second pastes 321a and 322a that compose the second thermoelectric member 32.

In the back-surface protective member 62 that is prepared, the first wiring pattern 314 and the second wiring pattern 324 are formed on one surface 62a.

Next, as shown in FIG. 20 by (b), the laminated body is heated and pressed. As a result, the front-surface protective member 20, the insulating substrate 10, and the back-surface protective member 62 are integrated. In addition, the first extending portion 311 and the second extending portion 312 of the first thermoelectric member 31 and the third extending portion 321 and the fourth extending portion 322 of the second thermoelectric member 32 are formed by the heating that is performed at this time.

Then, as shown in FIG. 20 by (c), the heat-receiving plate 51 is formed on the front surface of the base conductor pattern 53. In addition, the reflective plate 52 is formed on the front surface of the base conductor pattern 54.

The radiant heat sensor 101 according to the present embodiment is manufactured in this manner.

According to the present embodiment as well, the portion 15 of the insulating substrate 10 is present between the first extending portion 311 and the second extending portion 312 in the first thermoelectric member 31, in a manner similar to that according to the fifth embodiment. The portion 16 of the insulating substrate 10 is present between the third extending portion 321 and the fourth extending portion 322 in the second thermoelectric member 32 as well. Therefore, effects similar to those according to the fifth embodiment are achieved according to the present embodiment as well.

Seventh Embodiment

Figure 22:
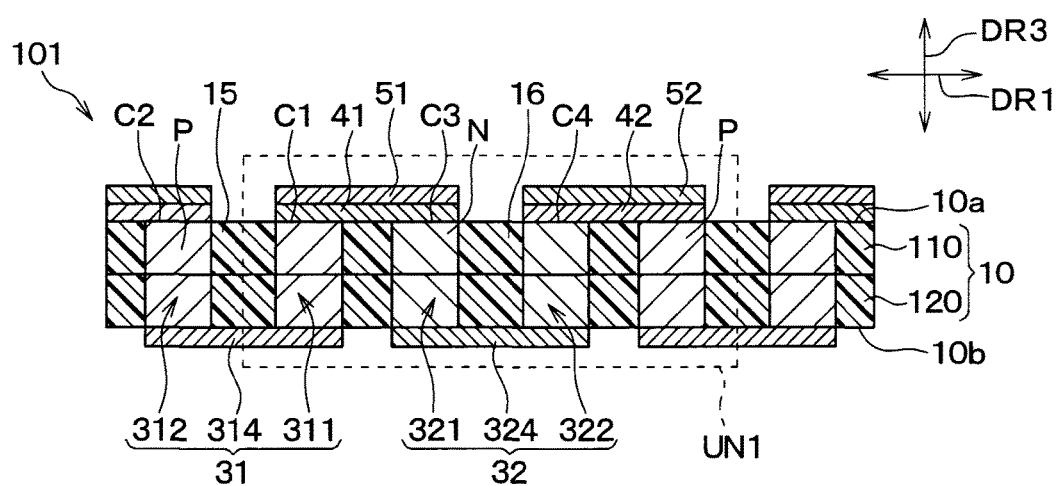
FIG. 22 is a cross-sectional view of a radiant heat sensor according to a seventh embodiment.

According to the present embodiment, the structure of the radiant heat sensor 101 is modified in relation to that according to the first embodiment. As shown in FIG. 22, in the radiant heat sensor 101 according to the present embodiment, the first thermoelectric member 31 and the second thermoelectric member 32 have structures similar to those in the radiant heat sensor 101 according to the sixth embodiment. However, the radiant heat sensor 101 according to the present embodiment differs from the radiant heat sensor 101 according to the sixth embodiment in terms of the following points.

According to the present embodiment, the insulating substrate 10 is configured by two layers, that is, a first insulating substrate 110 and a second insulating substrate 120. The first extending portion 311 and the second extending portion 312 of the first thermoelectric member 31 are formed in both the first insulating substrate 110 and the second insulating substrate 120. In a similar manner, the third extending portion 321 and the fourth extending portion 322 of the second thermoelectric member 32 are formed in both the first insulating substrate 110 and the second insulating substrate 120. The heat-receiving plate 51 is in direct contact with the first conductor pattern 41. The reflective plate 52 is in direct contact with the second conductor pattern 42.

Next, a manufacturing method of the radiant heat sensor 101 according to the present embodiment will be described with reference to FIG. 23 by (a) and (b), FIG. 24 by (a) to (d), and FIG. 25 by (a) to (c).

Figure 23:
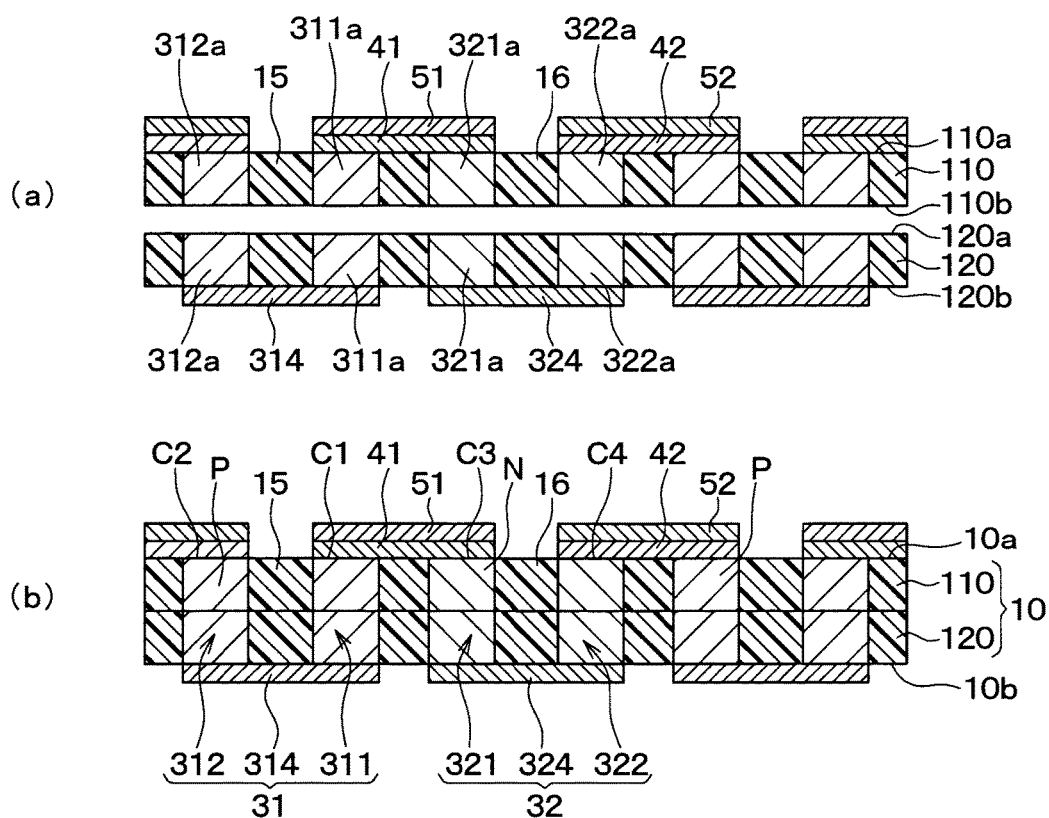
FIG. 23 is a cross-sectional view of manufacturing steps of the radiant heat sensor according to the seventh embodiment.

As shown in FIG. 23 by (a), the first insulating substrate 110 and the second insulating substrate 120 are prepared. A laminated body in which the first insulating substrate 110 and the second insulating substrate 120 are laminated is formed.

Figure 24:
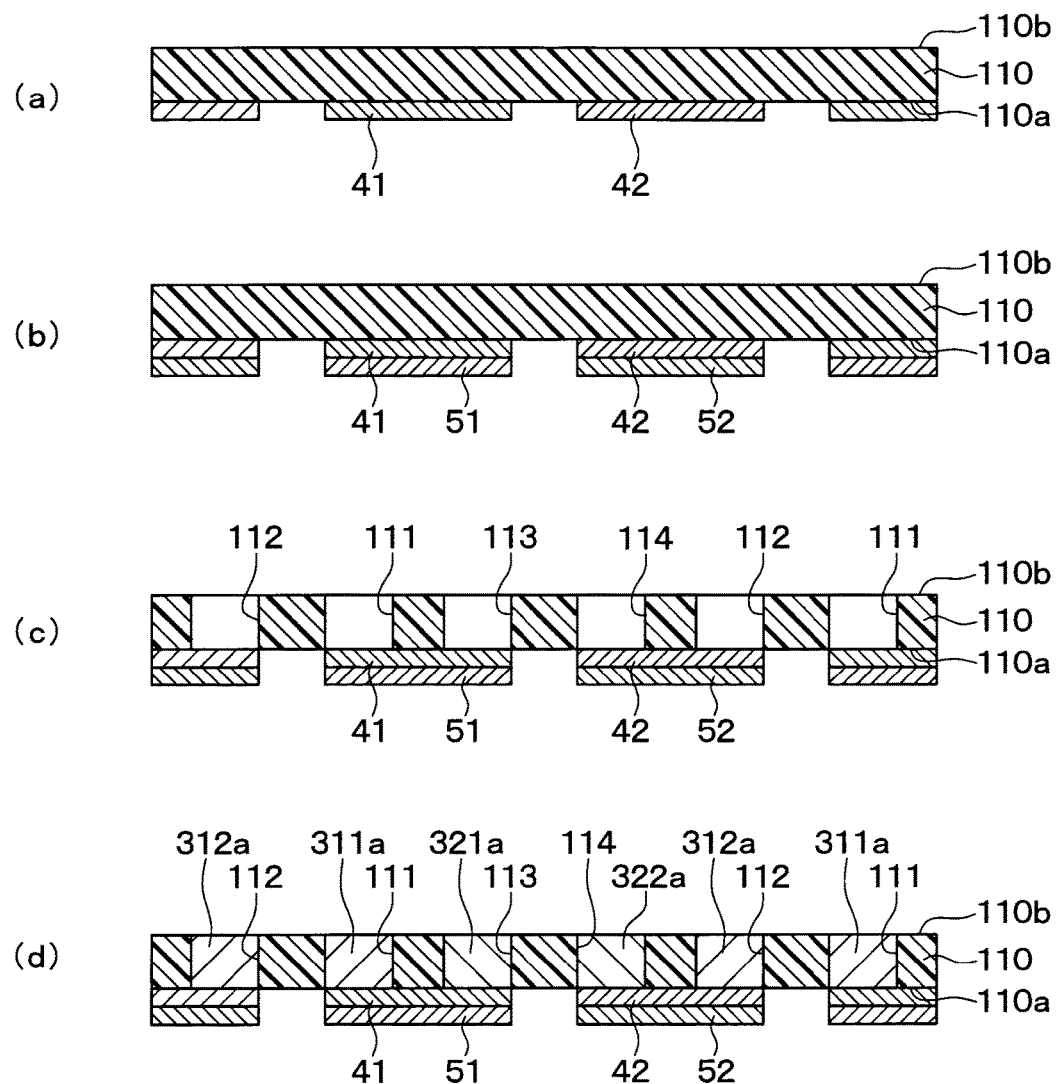
FIG. 24 is a cross-sectional view of manufacturing steps of the radiant heat sensor according to the seventh embodiment.

As described hereafter, the first insulating substrate 110 that is prepared is that which has undergone the steps shown in FIG. 24 by (a) to (d). That is, as shown in FIG. 24 by (a), the first insulating substrate 110 in which the first conductor pattern 41 and the second conductor pattern 42 are formed on one surface 110a is prepared. Next, as shown in FIG. 24 by (b), in a manner similar to that according to the first embodiment, the heat-receiving plate 51 is formed on the front surface of the first conductor pattern 41 and the reflective plate 52 is formed on the front surface of the second conductor pattern 42. Next, as shown in FIG. 24 by (c), via holes 111, 112, 113, and 114 are formed. The via holes 111, 112, 113, and 114 are respectively through holes for forming the first extending portion 311, the second extending portion 312, the third extending portion 321, and the fourth extending portion 322. Next, as shown in FIG. 24 by (d), the via holes 111 and 112 are respectively filled with the first pastes 311a and 312a that compose the first thermoelectric member 31. In a similar manner, the via holes 113 and 114 are respectively filled with the second pastes 321a and 322a that compose the second thermoelectric member 32.

Figure 25:
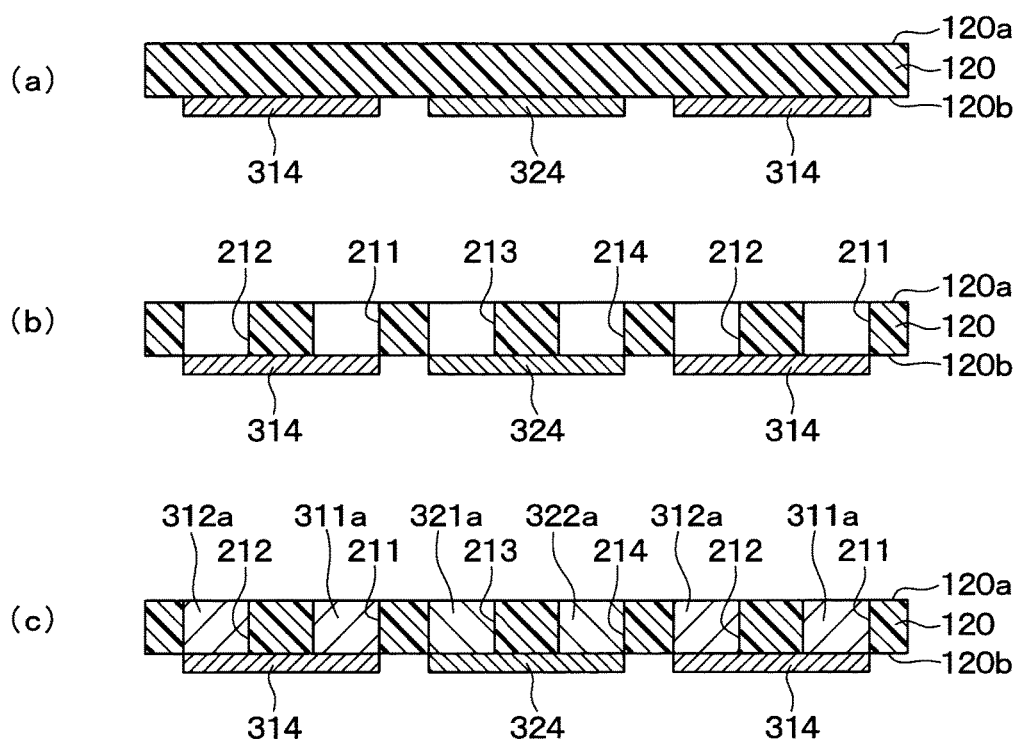
FIG. 25 is a cross-sectional view of manufacturing steps of the radiant heat sensor according to the seventh embodiment.

As described hereafter, the second insulating substrate 120 that is prepared is that which has undergone the steps shown in FIG. 25 by (a) to (c). That is, as shown in FIG. 25 by (a), the second insulating substrate 120 in which the first wiring pattern 314 and the second wiring pattern 324 are formed on one surface 120b is prepared. Next, as shown in FIG. 25 by (b), via holes 211, 212, 213, and 214 are formed. The via holes 211, 212, 213, and 214 are respectively through holes for forming the first extending portion 311, the second extending portion 312, the third extending portion 321, and the fourth extending portion 322. Next, as shown in FIG. 25 by (c), the via holes 211 and 212 are respectively filled with the first pastes 311a and 312a. In a similar manner, the via holes 213 and 214 are respectively filled with the second pastes 321a and 322a.

Next, as shown in FIG. 23(b), the laminated body is heated and pressed. As a result, the first insulating substrate 110 and the second insulating substrate 120 are integrated. In addition, the first extending portion 311 and the second extending portion 312 of the first thermoelectric member 31 and the third extending portion 321 and the fourth extending portion 322 of the second thermoelectric member 32 are formed by the heating that is performed at this time.

The radiant heat sensor 101 according to the present embodiment is manufactured in this manner. In the radiant heat sensor 101 according to the present embodiment, the first thermoelectric member 31 and the second thermoelectric member 32 have structures similar to those in the radiant heat sensor 101 according to the sixth embodiment. Therefore, effects similar to those according to the sixth embodiment are achieved.

Eighth Embodiment

Figure 26:
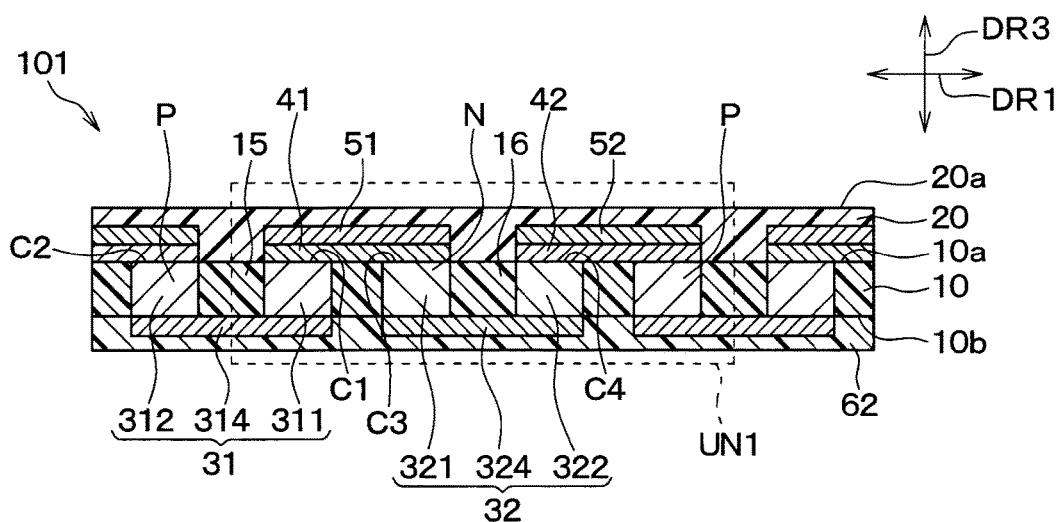
FIG. 26 is a cross-sectional view of a radiant heat sensor according to an eighth embodiment.

According to the present embodiment, the structure of the radiant heat sensor 101 is modified in relation to that according to the first embodiment. As shown in FIG. 26, in the radiant heat sensor 101 according to the present embodiment, the first thermoelectric member 31 and the second thermoelectric member 32 have structures similar to those in the radiant heat sensor 101 according to the sixth embodiment. However, the radiant heat sensor 101 according to the present embodiment differs from the radiant heat sensor 101 according to the sixth embodiment in that the heat-receiving plate 51 is in direct contact with the first conductor pattern 41 and the reflective plate 52 is in direct contact with the second conductor pattern 42. Effects similar to those according to the sixth embodiment are achieved according to the present embodiment as well.

In the radiant heat sensor 101 according to the present embodiment, the first wiring pattern 314 and the second wiring pattern 324 are covered by the back-surface protective member 62. However, the first wiring pattern 314 and the second wiring pattern 324 may not be covered by the back-surface protective member 62. This similarly applies to the radiant heat sensor 101 according to the sixth embodiment shown in FIG. 18.

Ninth Embodiment

Figure 27:
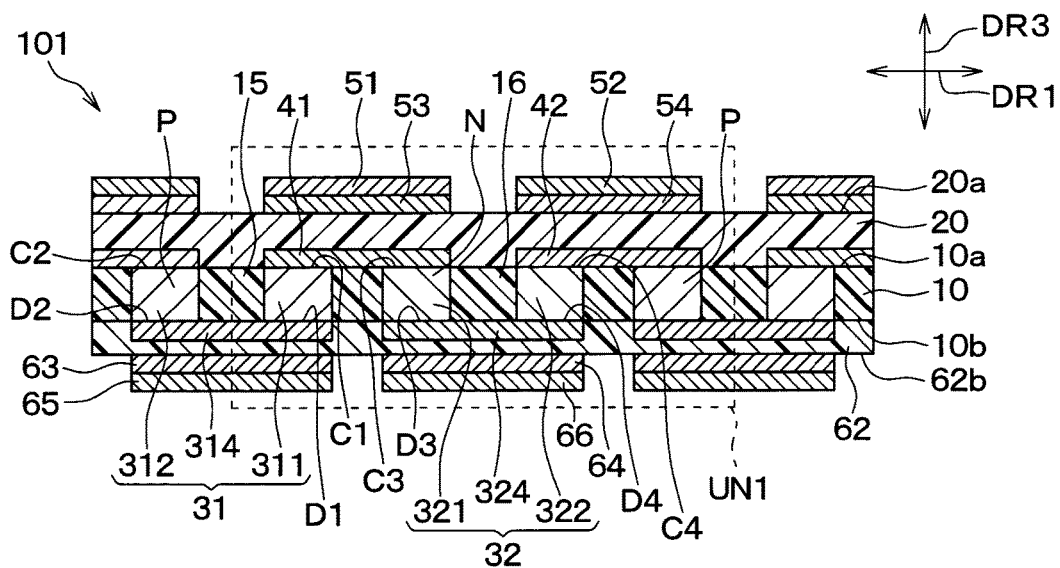
FIG. 27 is a cross-sectional view of a radiant heat sensor according to a ninth embodiment.

According to the present embodiment, the structure of the radiant heat sensor 101 is modified in relation to that according to the first embodiment. As shown in FIG. 27, the radiant heat sensor 101 according to the resent embodiment has a structure similar to that of the radiant heat sensor 101 according to the sixth embodiment shown in FIG. 18.

The radiant heat sensor 101 according to the present embodiment further includes heat conducting members 63, 64, 65, and 66 that are disposed on a surface 62b of the back-surface protective member 62 on the side opposite the first and second wiring patterns 314 and 324 side. The heat conducting members 63, 64, 65, and 66 are members that have higher heat conductance than the back-surface protective member 62. According to the present embodiment, base conductor patterns 63 and 64 that are made of copper, and gold-plating layers 65 and 66 that are formed on the front surfaces of the base conductor patterns 63 and 64 are used as the heat conducting members.

The base conductor pattern 63 and the gold-plating layer 65 on the front surface thereof have the same shape and size as the first wiring pattern 314, and directly face the first wiring pattern 314 in the third direction DR3. The base conductor pattern 63 and the gold-plating layer 65 on the front surface thereof configure a first heat conducting member.

In a similar manner, the base conductor pattern 64 and the gold-plating layer 66 on the front surface thereof have the same shape and size as the second wiring pattern 324, and directly face the second wiring pattern 324 in the third direction DR3. The base conductor pattern 64 and the gold-plating layer 66 on the front surface thereof configure a second heat conducting member.

Next, a manufacturing method of the radiant heat sensor 101 according to the present embodiment will be described with reference to FIG. 28 by (a) to (c).

Figure 28:
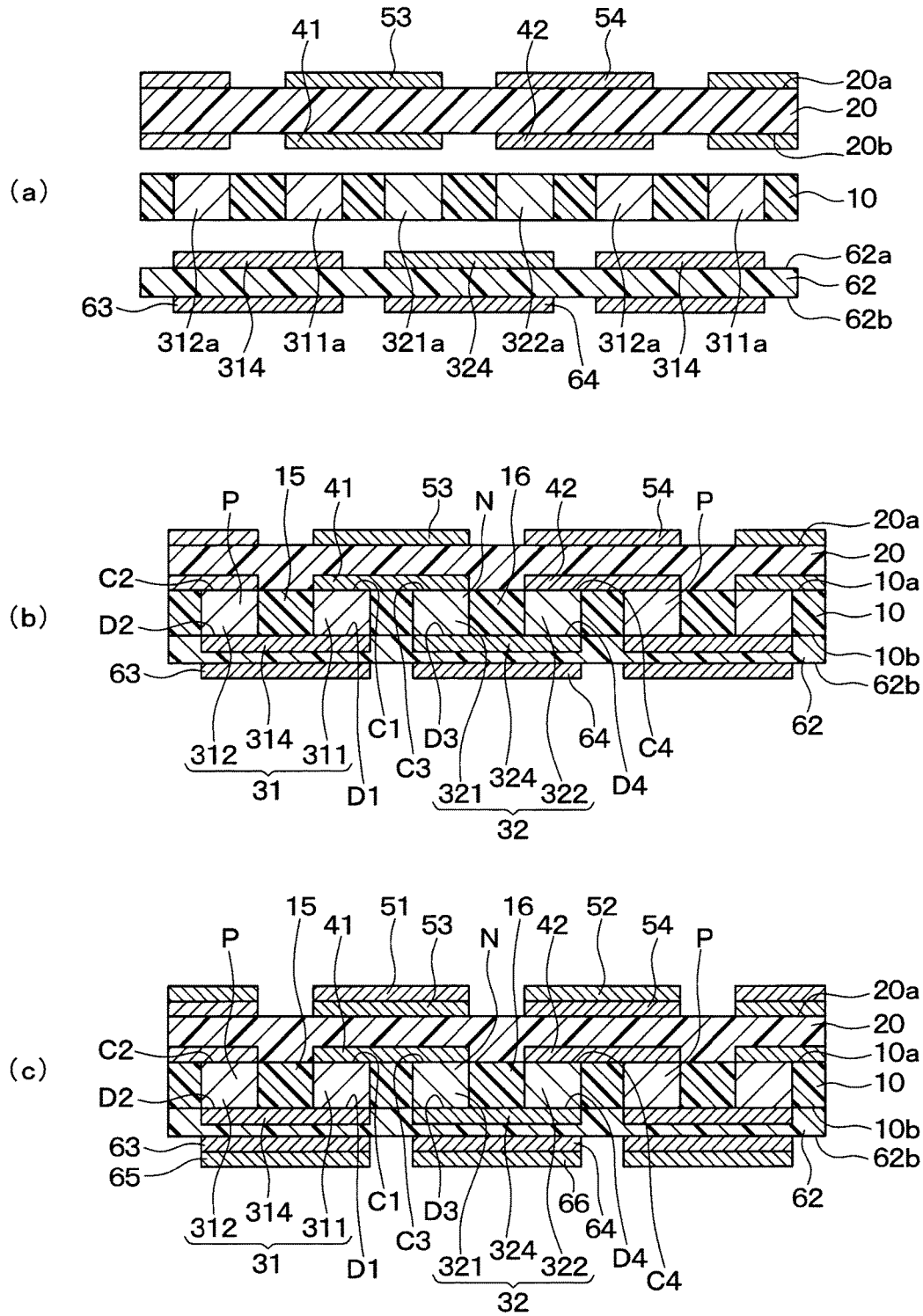
FIG. 28 is a cross-sectional view of manufacturing steps of the radiant heat sensor according to the ninth embodiment.

As shown in FIG. 28 by (a), the front-surface protective member 20, the insulating substrate 10, and the back-surface protective member 62 are prepared. A laminated body in which the front-surface protective member 20, the insulating substrate 10, and the back-surface protective member 62 are laminated is formed.

The front-surface protective member 20 and the insulating substrate 10 that are prepared at this time are identical to the front-surface protective member 20 and the insulating substrate 10 shown in FIG. 20 by (a). In the back-surface protective member 62 that is prepared at this time, the first wiring pattern 314 and the second wiring pattern 324 are formed on one surface 62a and the base conductor patterns 63 and 64 are formed on the other surface 62b.

Next, as shown in FIG. 28 by (b), the laminated body is heated and pressed. This step is identical to the step shown in FIG. 20 by (b).

Then, as shown in FIG. 28 by (c), the heat-receiving plate 51 is formed on the front surface of the base conductor pattern 53. In addition, the reflective plate 52 is formed on the base conductor pattern 54. Furthermore, the gold-plating layers 65 and 66 are formed on the base conductor patterns 63 and 64.

The radiant heat sensor 101 according to the present embodiment is manufactured in this manner.

In cases in which the structure of the first thermoelectric member 31 is a structure in which the first extending portion 311 and the second extending portion 312 are connected by the first wiring pattern 314, the Seebeck effect occurs should a temperature difference occur between a connecting portion D1 of the first wiring pattern 314 and the first extending portion 311 and a connecting portion D2 of the first wiring pattern 314 and the second extending portion 312. This similarly applies to cases in which the structure of the second thermoelectric member 32 is a structure in which the third extending portion 321 and the fourth extending portion 322 are connected by the second wiring portion 324. The Seebeck effect occurs should a temperature difference occur between a connecting portion D3 of the second wiring pattern 324 and the third extending portion 321 and a fourth connecting portion D4 of the second wiring pattern 324 and the fourth extending portion 322. When the Seebeck effect occurs in this manner, the detection sensitivity of the radiant heat sensor 101 decreases.

Here, in the radiant heat sensor 101 according to the present embodiment, the heat conducting members 63, 64, 65, and 66 are disposed on the surface 62b of the back-surface protective member 62. The heat conducting members 63, 64, 65, and 66 function as soaking members that perform soaking between the first wiring pattern 314 and the second wiring pattern 324. Therefore, as a result of the first heat conducting members 63 and 65, the first connecting portion D1 and the second connecting portion D2 can be brought closer to the same temperature. As a result of the second heat conducting members 64 and 66, the third connecting portion D3 and the fourth connecting portion D4 can be brought closer to the same temperature.

Consequently, as a result of the radiant heat sensor 101 according to the present embodiment, detection sensitivity can be improved, compared to cases in which the heat conducting members 63, 64, 65, and 66 are not provided.

According to the present embodiment, the first heat conducting members 63 and 65 are disposed in an area of the surface 62b of the back-surface protective member 62 that directly faces the overall first wiring pattern 314. However, the disposal location of the first heat conducting members 63 and 65 is not limited thereto. The first heat conducting members 63 and 65 are merely required to be disposed in an area that extends from a position opposing at least a portion of the first connecting portion D1 in a direction perpendicular to the front surface 10a of the insulating substrate 10 to a position opposing at least a portion of the second connecting portion D2 in a direction perpendicular to the front surface 10a of the insulating substrate 10. As a result of the first heat conducting members 63 and 65 being disposed in this manner, the first connecting portion D1 and the second connecting portion D2 can be brought closer to the same temperature.

In a similar manner, the second heat conducting members 64 and 66 are also merely required to be disposed in an area that extends from a position opposing at least a portion of the third connecting portion D3 in a direction perpendicular to the front surface 10a of the insulating substrate 10 to a position opposing at least a portion of the fourth connecting portion D4 in a direction perpendicular to the front surface 10a of the insulating substrate 10. As a result of the second heat conducting members 64 and 66 being disposed in this manner, the third connecting portion D3 and the fourth connecting portion D4 can be brought closer to the same temperature.

Figure 29:
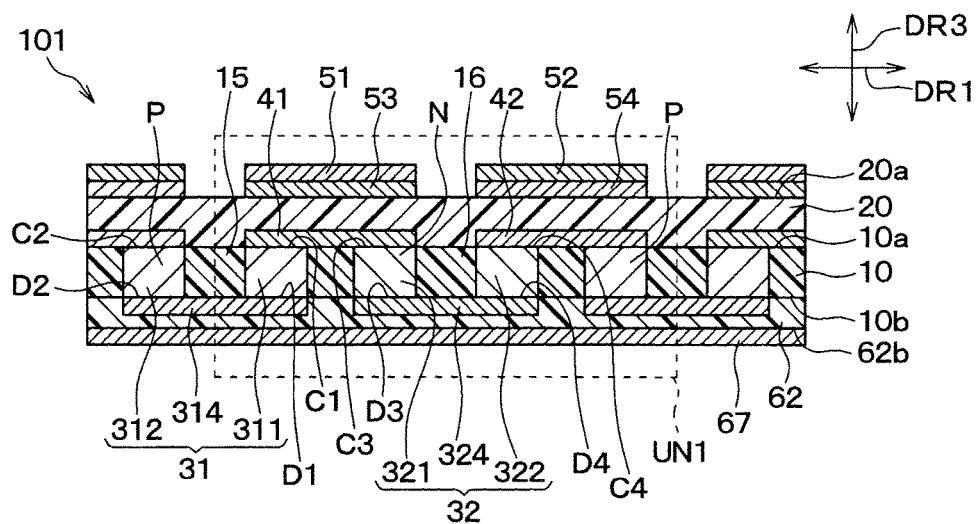
FIG. 29 is a cross-sectional view of the radiant heat sensor according to the ninth embodiment.

Therefore, the first heat conducting members 63 and 65 and the second heat conducting members 64 and 66 may be connected. That is, as shown in FIG. 29, a heat conducting member 67 may be disposed over the overall area of the surface 62b of the back-surface protective member 62. The heat conducting member 67 shown in FIG. 29 is configured by a single layer of a conductor such as copper foil. The heat conducting member may be configured by a single layer in this manner.

Tenth Embodiment

Figure 30:
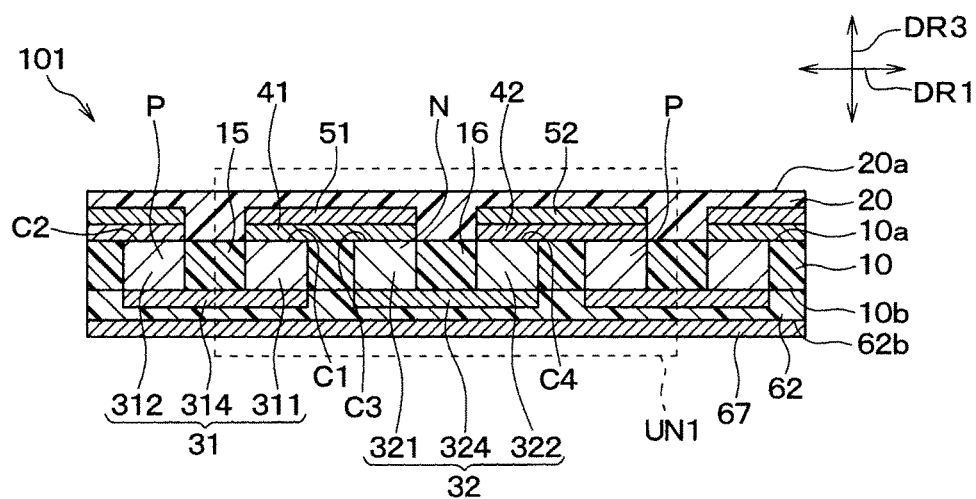
FIG. 30 is a cross-sectional view of a radiant heat sensor according to a tenth embodiment.

According to the present embodiment, the structure of the radiant heat sensor 101 is modified in relation to that according to the first embodiment. As shown in FIG. 30, the radiant heat sensor 101 according to the present embodiment is that in which the back-surface protective member 62 and the heat conducting member 67 are added to the radiant heat sensor 101 according to the eighth embodiment shown in FIG. 26. The purpose of the heat conducting member 67 is the same as that described according to the ninth embodiment. The heat conducting member 67 is disposed over the overall area of the surface 62b of the back-surface protective member 62. Effects similar to those according to the ninth embodiment are achieved in cases in which the heat conducting member 67 is disposed in this manner as well.

Eleventh Embodiment

Figure 31:
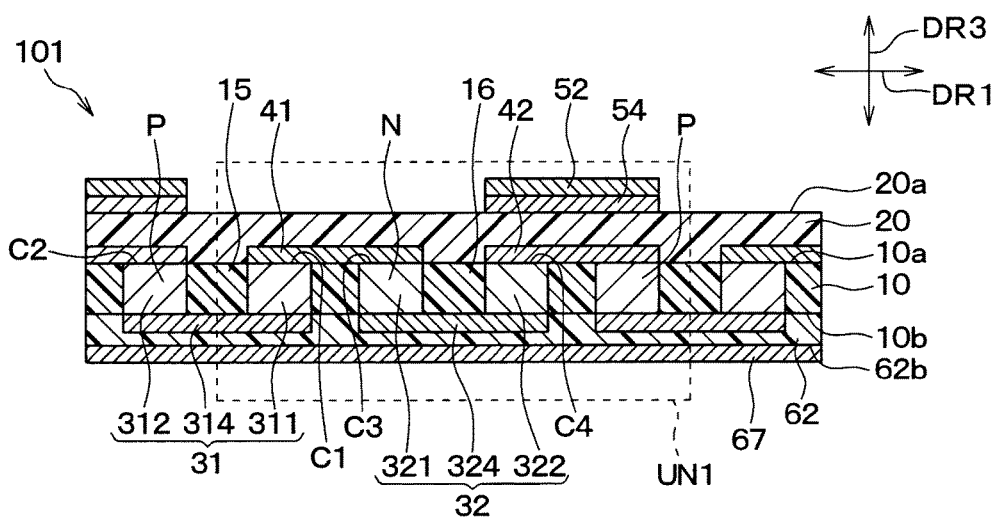
FIG. 31 is a cross-sectional view of a radiant heat sensor according to an eleventh embodiment.

According to the present embodiment, the structure of the radiant heat sensor 101 is modified in relation to that according to the first embodiment. As shown in FIG. 31, the radiant heat sensor 101 according to the present embodiment has a structure similar to that of the radiant heat sensor 101 according to the sixth embodiment shown in FIG. 18. The radiant heat sensor 101 according to the present embodiment further includes the heat conducting member 67 that is disposed on the surface 62b of the back-surface protective member 62, in a manner similar to that of the radiant heat sensor 101 according to the ninth and tenth embodiments.

In addition, in the radiant heat sensor 101 according to the present embodiment, the front-surface protective member 20 is present on the front surface of the first conductor pattern 41. The front-surface protective member 20 is made of a thermoplastic resin that has higher emissivity of radiant heat than the first conductor pattern 41. Therefore, according to the present embodiment, the front-surface protective member 20 functions as a heat-receiving member that transmits heat generated as a result of absorption of radiant heat to the first conductor pattern 41.

Meanwhile, the reflective plate 52 is present on the front surface of the second conductor pattern 42 with the front-surface protective member 20 therebetween. Therefore, radiant heat that is irradiated towards the second conductor pattern 42 is reflected by the reflective plate 52.

As a result, when radiant heat is irradiated onto the front surface 101a side of the radiant heat sensor 101 according to the present embodiment, the front-surface protective member 20 absorbs the radiant heat and the reflective plate 52 reflects the radiant heat. The first conductor pattern 41 receives heat from the front-surface protective member 20. The quantity of heat received by the second conductor pattern 42 from the reflective plate 52 is small. Therefore, a large temperature difference occurs between the first conductor pattern 41 and the second conductor pattern 42. Consequently, as a result of the radiant heat sensor 101 according to the present embodiment as well, the detection sensitivity of the radiant heat sensor 101 can be improved in a manner similar to that in the radiant heat sensor 101 according to the first embodiment.

The radiant heat sensor 101 according to the present embodiment is manufactured by the manufacturing steps of the radiant heat sensor 101 shown in FIG. 20 by (a) to (c), described according to the sixth embodiment, being modified in the following manner.

At the step shown in FIG. 20 by (a), the front-surface protective member 20 in which the first conductor pattern 41 and the second conductor pattern 42 are formed on one surface 20b and the base conductor pattern 54 is formed on one surface 20b is prepared. In addition, the back-surface protective member 62 in which the first wiring pattern 314 and the second wiring pattern 324 are formed on one surface 62a and copper foil serving as the heat conducting member 67 is formed on one surface 62b is prepared. At the step shown in FIG. 20 by (c), the reflective plate 52 is formed on the front surface of a base conductor pattern 44.

Twelfth Embodiment

Figure 32:
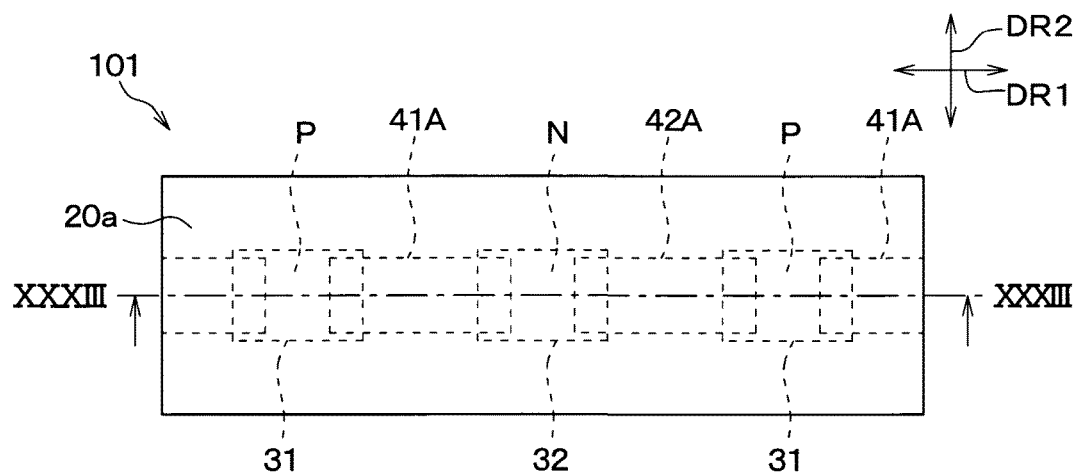
FIG. 32 is a plan view of a radiant heat sensor according to a twelfth embodiment.
Figure 33:
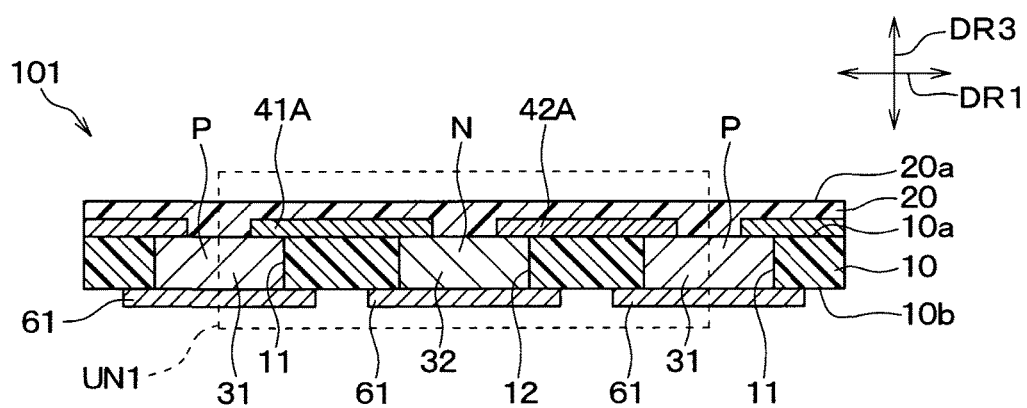
FIG. 33 is a cross-sectional view taken along line XXXIII-XXXIII in FIG. 32.

According to the present embodiment, the structure of the radiant heat sensor 101 is modified in relation to that according to the first embodiment. As shown in FIGS. 32 and 33, the radiant heat sensor 101 according to the present embodiment differs from the radiant heat sensor 101 according to the first embodiment in that a first conductor pattern 41A also serves as a heat-receiving member and a second conductor pattern 42A also serves as a reflective member. Other configurations are identical to those of the radiant heat sensor 101 according to the first embodiment.

The first conductor pattern 41A and the second conductor pattern 42A according to the present embodiment are composed conductive materials that have differing emissivity. The first conductor pattern 41A is made of a conductive material that has higher emissivity of radiant heat within the wavelength of visible light than that of the second conductor pattern 42A. For example, as a conductive material that has higher emissivity of radiant heat within the wavelength of visible light, carbon is given. As a conductive material that has lower emissivity, gold and silver are given. In cases in which the radiant heat sensor 101 is to detect radiant heat within the infrared range, the first conductor pattern 41A is made of a conductive material that has higher emissivity within the infrared range than that of the second conductor pattern 42A.

In addition, according to the present embodiment, the absorption rate for radiant heat of the front-surface protective member 20 is preferably set to be low. For example, the thickness of the front-surface protective member 20 is preferably set to be thin or the front-surface protective member 20 is preferably made of a material that has low emissivity. More specifically, in cases in which the radiant heat sensor 101 is to detect radiant heat within the visible light range, the front-surface protective member 20 is preferably made of a transparent resin.

Next, a manufacturing method of the radiant heat sensor 101 according to the present embodiment will be described with reference to FIG. 34 by (a) to (f). The steps shown in FIG. 34 by (a) to (c) are identical to the steps shown in FIG. 4 by (a) to (c).

Figure 34:
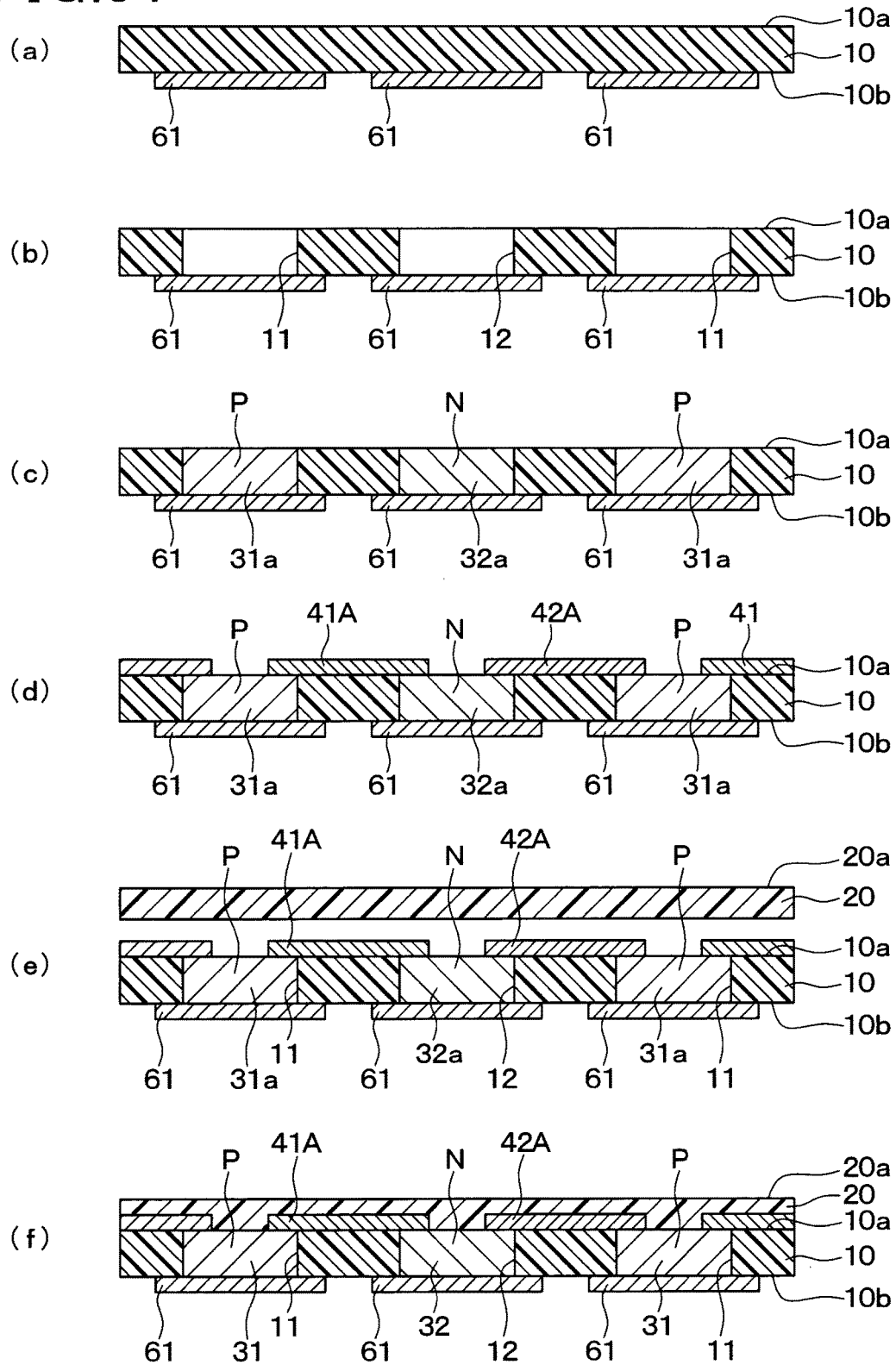
FIG. 34 is a cross-sectional view of manufacturing steps of the radiant heat sensor according to the twelfth embodiment.

At the step shown in FIG. 34 by (d), the first conductor pattern 41A is formed by a conductive material having high emissivity being vapor-deposited on the front surface 10a of the insulating substrate 10. The second conductor pattern 42A is formed by a conductive material having low emissivity being vapor-deposited on the front surface 10a of the insulating substrate 10.

Next, as shown in FIG. 34 by (e), the front-surface protective member 20 is prepared. A laminated body is formed by the front-surface protective member 20 and the insulating substrate 10 that has undergone the step shown in FIG. 34 by (d) being laminated. Subsequently, as shown in FIG. 34 by (f), the laminated body is heated and pressed. As a result, the radiant heat sensor 101 according to the present embodiment is manufactured.

In the radiant heat sensor 101 according to the present embodiment, the first conductor pattern 41A is made of a material that has higher emissivity of radiant heat than that of the second conductor pattern 42A. Therefore, when radiant heat is irradiated onto the front surface 10a of the radiant heat sensor 101, the first conductor pattern 41A absorbs more heat than the second conductor pattern 42A. As a result, the quantity of heat that is generated as a result of absorption is larger in the first conductor pattern 41A than the second conductor pattern 42A, and the temperature of the first conductor pattern 41A becomes higher. In this manner, in the radiant heat sensor 101 according to the present embodiment, the first conductor pattern 41A and the second conductor pattern 42A receive heat due to radiant heat. In addition, the quantities of heat received by the first conductor pattern 41A and the second conductor pattern 42A differ. Furthermore, the thermoelectric conversion element UN1 generates an electrical output based on the temperature difference between the first and second conductor patterns 41A and 42A.

In the radiant heat sensor 101 according to the present embodiment as well, the heat-receiving areas over which the hot contact portion 41 and the cold contact portion 42 respectively receive radiant heat can be increased, compared to the radiant heat sensor J1 of the consideration example.

Therefore, effects similar to those according to the first embodiment are achieved according to the present embodiment as well.

Thirteenth Embodiment

Figure 35:
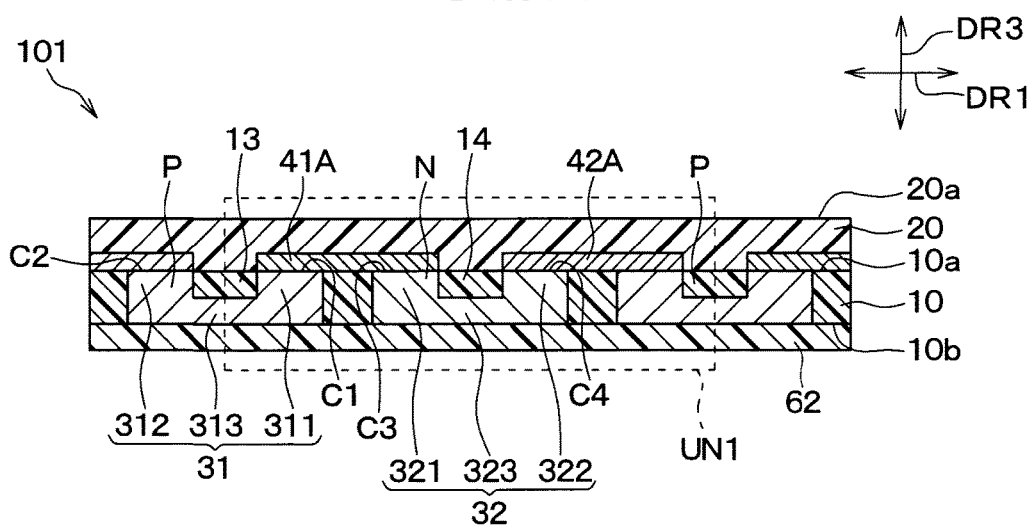
FIG. 35 is a cross-sectional view of a radiant heat sensor according to a thirteenth embodiment.

According to the present embodiment, the structure of the radiant heat sensor 101 is modified in relation to that according to the first embodiment. As shown in FIG. 35, in the radiant heat sensor 101 according to the present embodiment, the first conductor pattern 41A also serves as a heat-receiving member and the second conductor pattern 42A also serves as a reflective member in a manner similar to that in the radiant heat sensor 101 according to the twelfth embodiment. Other configurations are identical to those of the radiant heat sensor 101 according to the fifth embodiment in FIG. 13.

Next, a manufacturing method of the radiant heat sensor 101 according to the present embodiment will be described with reference to FIG. 36 by (a) to (d).

Figure 36:
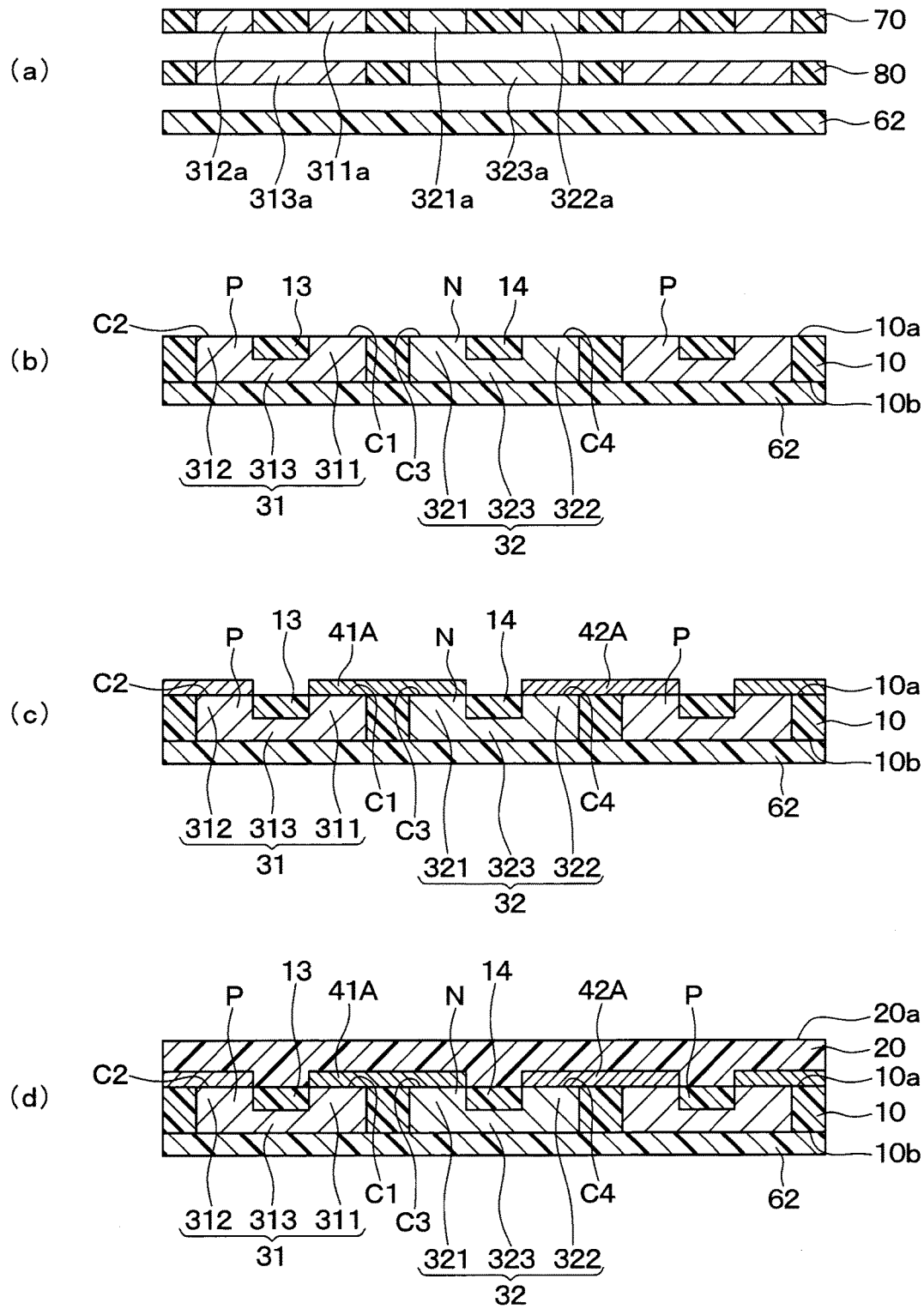
FIG. 36 is a cross-sectional view of manufacturing steps of the radiant heat sensor according to the thirteenth embodiment.

As shown in FIG. 36 by (a), the first insulating substrate 70, the second insulating substrate 80, and the back-surface protective member 62 are prepared. A laminated body in which the first insulating substrate 70, the second insulating substrate 80, and the back-surface protective member 62 are laminated is formed.

The first insulating substrate 70 that is prepared is that which has undergone the steps shown in FIG. 15 by (a) to (c), in a manner similar to that according to the fifth embodiment. The second insulating substrate 80 that is prepared is that which has undergone the steps shown in FIG. 16 by (a) to (c), in a manner similar to that according to the fifth embodiment.

Next, as shown in FIG. 36 by (b), the laminated body is heated and pressed. As a result, the first insulating substrate 70, the second insulating substrate 80, and the back-surface protective member 62 are integrated. The insulating substrate 10 is formed by the first insulating substrate 70 and the second insulating substrate 80 being integrated. In addition, the first thermoelectric member 31 and the second thermoelectric member 32 are formed by the heating that is performed at this time.

Next, as shown in FIG. 36 by (c), the first conductor pattern 41A is formed by a conductive material having high emissivity being vapor-deposited on the front surface 10a of the insulating substrate 10. The second conductor pattern 42A is formed by a conductive material having low emissivity being vapor-deposited on the front surface 10a of the insulating substrate 10.

Next, as shown in FIG. 36 by (d), the front-surface protective member 20 is prepared. A laminated body is formed by the front-surface protective member 20 and the insulating substrate 10 that has undergone the step shown in FIG. 36 by (c) being laminated. Subsequently, the laminated body is heated and pressed. As a result, the radiant heat sensor 101 according to the present embodiment is manufactured.

As a result of the radiant heat sensor 101 according to the present embodiment, effects similar to those of the radiant heat sensors 101 according to the fifth and twelfth embodiments are achieved.

Fourteenth Embodiment

Figure 37:
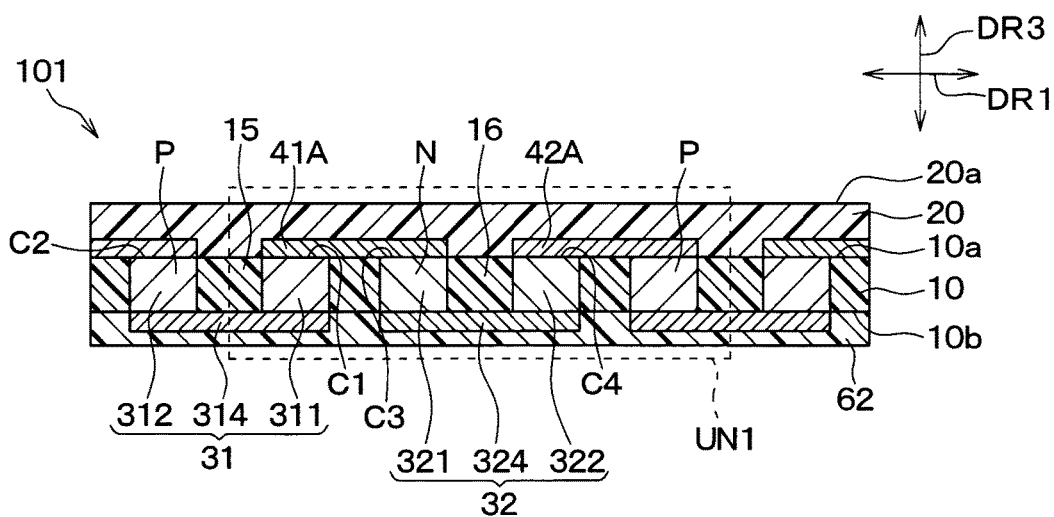
FIG. 37 is a cross-sectional view of a radiant heat sensor according to a fourteenth embodiment.

According to the present embodiment, the structure of the radiant heat sensor 101 is modified in relation to that according to the first embodiment. As shown in FIG. 37, in the radiant heat sensor 101, the first conductor pattern 41A also serves as a heat-receiving member and the second conductor pattern 42A also serves as a reflective member in a manner similar to that in the radiant heat sensor 101 according to the twelfth embodiment. Other configurations are identical to those of the radiant heat sensor 101 according to the sixth embodiment in FIG. 18.

Next, a manufacturing method of the radiant heat sensor 101 according to the present embodiment will be described with reference to FIG. 38 by (a) to (d).

Figure 38:
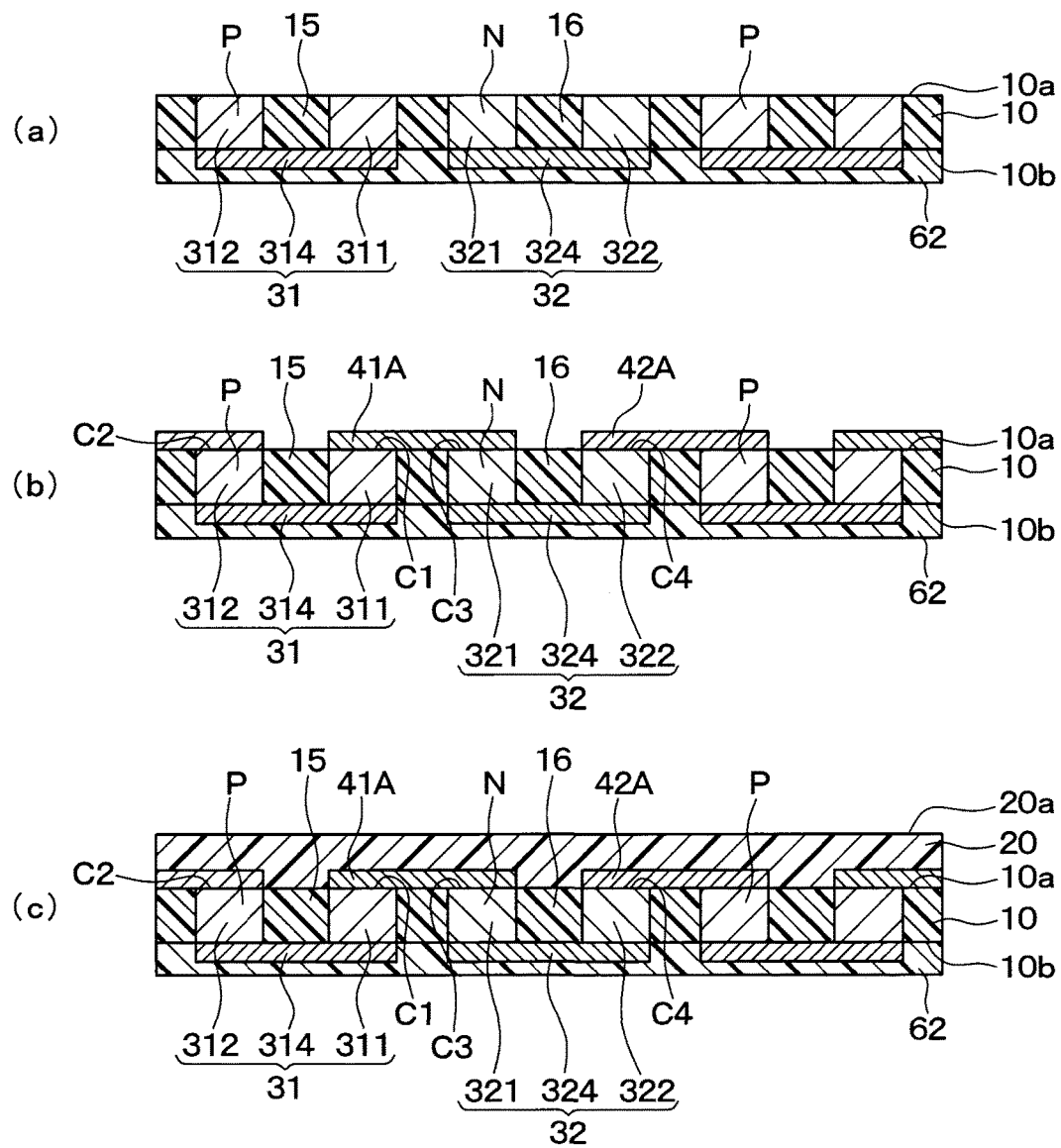
FIG. 38 is a cross-sectional view of manufacturing steps of the radiant heat sensor according to the fourteenth embodiment.

As shown in FIG. 38 by (a), the insulating substrate 10 and the back-surface protective member 62 are prepared. A laminated body in which the insulating substrate 10 and the back-surface protective member 62 are laminated is formed. The insulating substrate 10 that is prepared is that which has undergone the steps shown in FIG. 21 by (a) to (c). The back-surface protective member 62 that is prepared is that in which the first wiring pattern 314 and the second wiring pattern 324 are formed on one surface.

Then, the laminated body is heated and pressed. As a result, the insulating substrate 10 and the back-surface protective member 62 are integrated. In addition, the first extending portion 311 and the second extending portion 312 of the first thermoelectric member 31, and the third extending portion 321 and the fourth extending portion 322 of the second thermoelectric member 32 are formed by the heating that is performed at this time.

Next, as shown in FIG. 38 by (b), the first conductor pattern 41A is formed by a conductive material having high emissivity being vapor-deposited on the front surface 10a of the insulating substrate 10. The second conductor pattern 42A is formed by a conductive material having low emissivity being vapor-deposited on the front surface 10a of the insulating substrate 10.

Next, as shown in FIG. 38 by (c), the front-surface protective member 20 is prepared. A laminated body is formed by the front-surface protective member 20, the insulating substrate 10 that has undergone the step shown in FIG. 38 by (b), and the back-surface protective member 62 being laminated. Subsequently, the laminated body is heated and pressed. The radiant heat sensor 101 according to the present embodiment is manufactured in this manner.

As a result of the radiant heat sensor 101 according to the present embodiment, effects similar to those of the radiant heat sensor 101 according to the sixth and twelfth embodiment are achieved.

Fifteenth Embodiment

Figure 39:
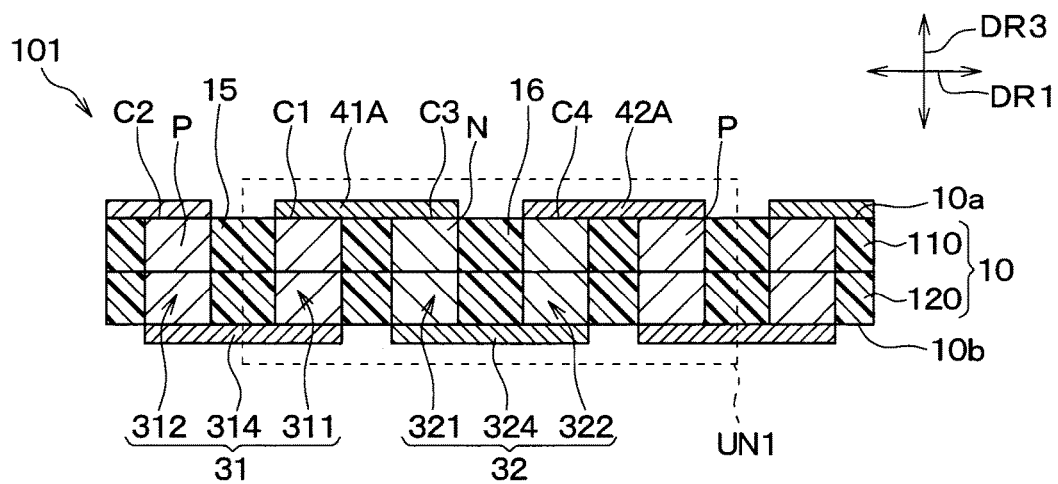
FIG. 39 is a cross-sectional view of a radiant heat sensor according to a fifteenth embodiment.

According to the present embodiment, the structure of the radiant heat sensor 101 is modified in relation to that according to the first embodiment. As shown in FIG. 39, in the radiant heat sensor 101, the first conductor pattern 41A also serves as a heat-receiving member and the second conductor pattern 42A also serves as a reflective member in a manner similar to that in the radiant heat sensor 101 according to the twelfth embodiment. Other configurations are identical to those of the radiant heat sensor 101 according to the seventh embodiment in FIG. 22.

Next, a manufacturing method of the radiant heat sensor 101 according to the present embodiment will be described with reference to FIG. 40 by (a) and (b), and FIG. 41 by (a) to (d).

Figure 40:
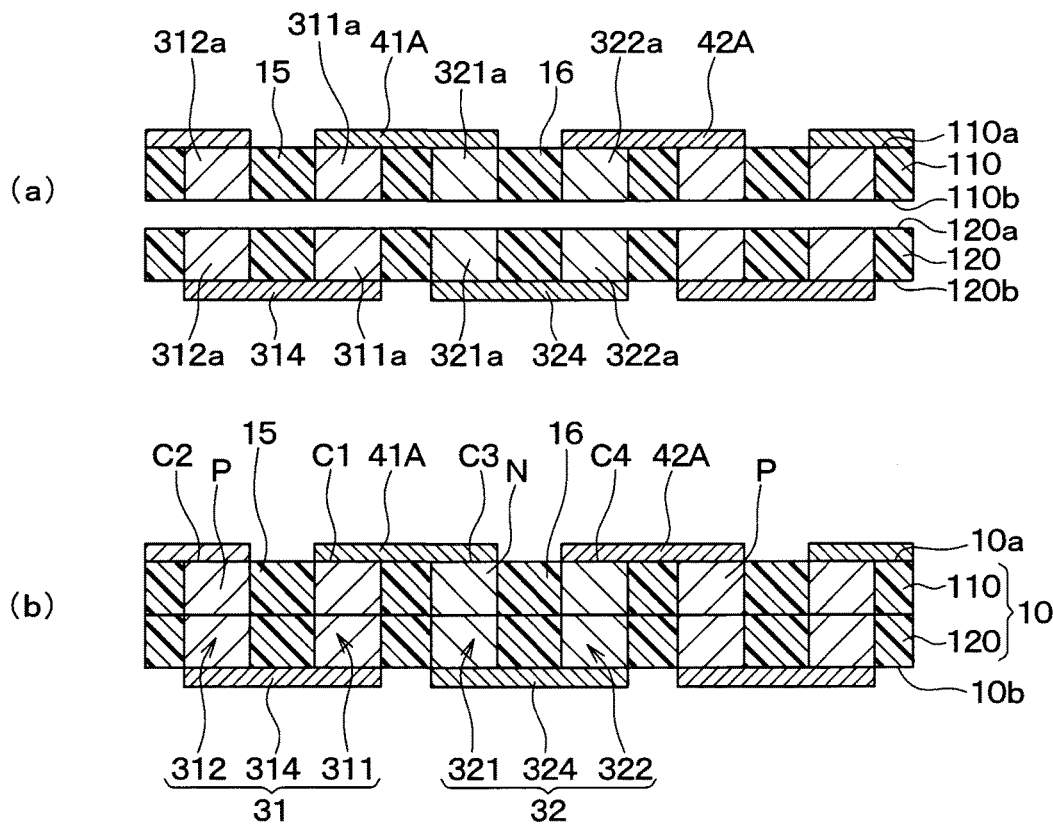
FIG. 40 is a cross-sectional view of manufacturing steps of the radiant heat sensor according to the fifteenth embodiment.
Figure 41:
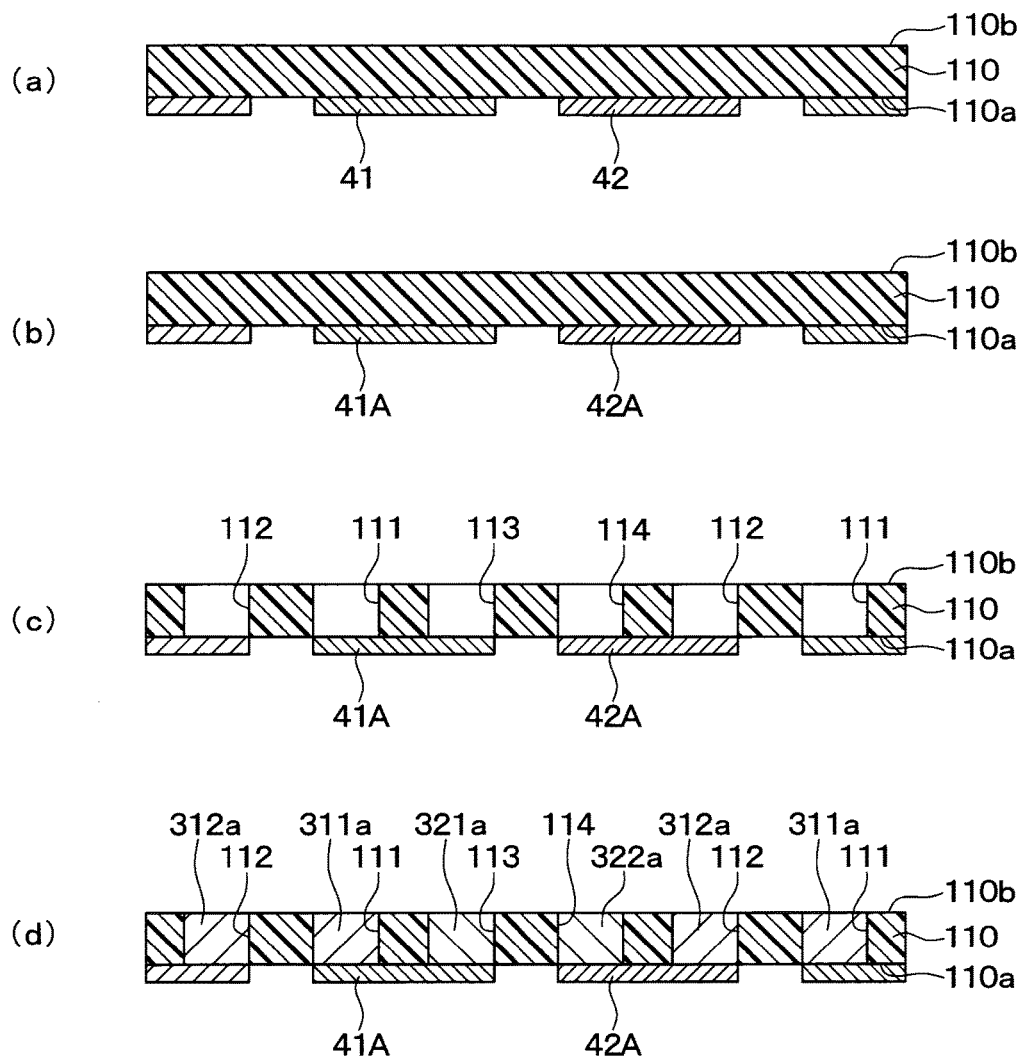
FIG. 41 is a cross-sectional view of manufacturing steps of the radiant heat sensor according to the fifteenth embodiment.

As shown in FIG. 40 by (a), the first insulating substrate 110 and the second insulating substrate 120 are prepared. A laminated body in which the first insulating substrate 110 and the second insulating substrate 120 are laminated is formed.

The first insulating substrate 110 that is prepared is that which has undergone the steps shown in FIG. 41 by (a) to (d), as described below. That is, as shown in FIG. 41 by (a), the conductor patterns 41 and 42 that are patterned into desired shapes by etching of a copper foil formed on one surface 110*a* is formed. Next, as shown in FIG. 41 by (b), of the conductor patterns 41 and 42, only the conductor pattern 41 is subjected to an oxidation treatment. The first conductor pattern 41A made of copper oxide and the second conductor pattern 42A made of copper are thereby formed. As a result of only either of the conductor patterns 41 and 42 being subjected to a chemical treatment in this manner, the first conductor pattern 41A can be made of a material having higher emissivity of radiant heat than that of the second conductor pattern 42A. Next, as shown in FIG. 41 by (c) and (d), the via holes 111, 112, 113, and 114 are formed and filled with the first pastes 311*a* and 312*a* and the second pastes 321*a* and 322*a*. The steps shown in FIG. 41 by (c) and (d) are identical to the steps shown in FIG. 24 by (c) and (d).

The second insulating substrate 120 that is prepared is that which has undergone the steps shown in FIG. 25 by (a) to (c) according to the seventh embodiment.

Next, as shown in FIG. 40 by (b), the laminated body is heated and pressed. As a result, the first insulating substrate 110 and the second insulating substrate 120 are integrated. In addition, the first extending portion 311 and the second extending portion 312 of the first thermoelectric member 31, and the third extending portion 321 and the fourth extending portion 322 of the second thermoelectric member 32 are formed by the heating that is performed at this time. The radiant heat sensor 101 according to the present embodiment is manufactured in this manner.

As a result of the radiant heat sensor 101 according to the present embodiment, effects similar to those of the radiant heat sensor 101 according to the seventh and twelfth embodiment are achieved.

Sixteenth Embodiment

Figure 42:
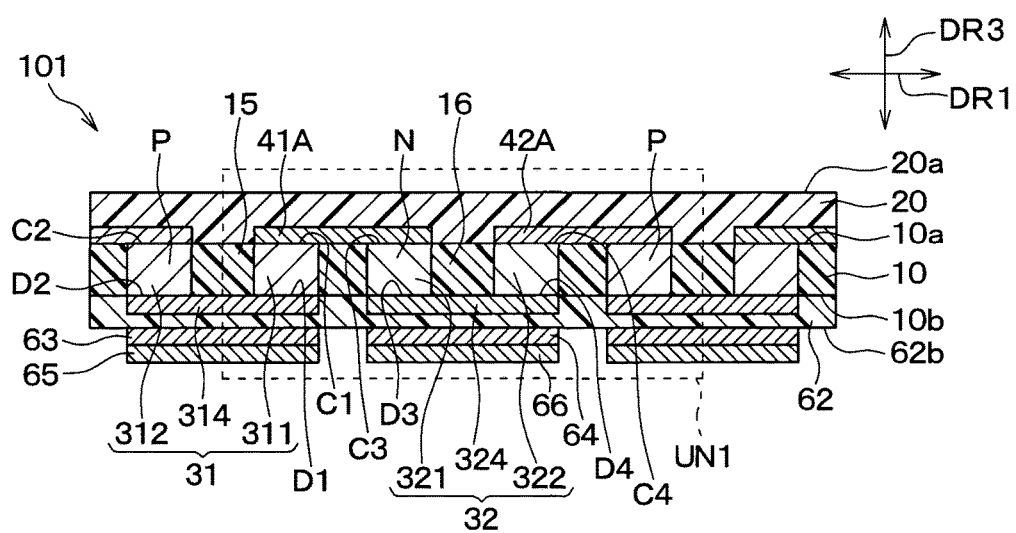
FIG. 42 is a cross-sectional view of a radiant heat sensor according to a sixteenth embodiment.

According to the present embodiment, the structure of the radiant heat sensor 101 is modified in relation to that according to the first embodiment. As shown in FIG. 42, in the radiant heat sensor 101, the first conductor pattern 41A also serves as a heat-receiving member and the second conductor pattern 42A also serves as a reflective member in a manner similar to that in the radiant heat sensor 101 according to the twelfth embodiment. Other configurations are identical to those of the radiant heat sensor 101 according to the ninth embodiment in FIG. 27.

Next, a manufacturing method of the radiant heat sensor 101 according to the present embodiment will be described with reference to FIG. 43 by (a) to (c).

Figure 43:
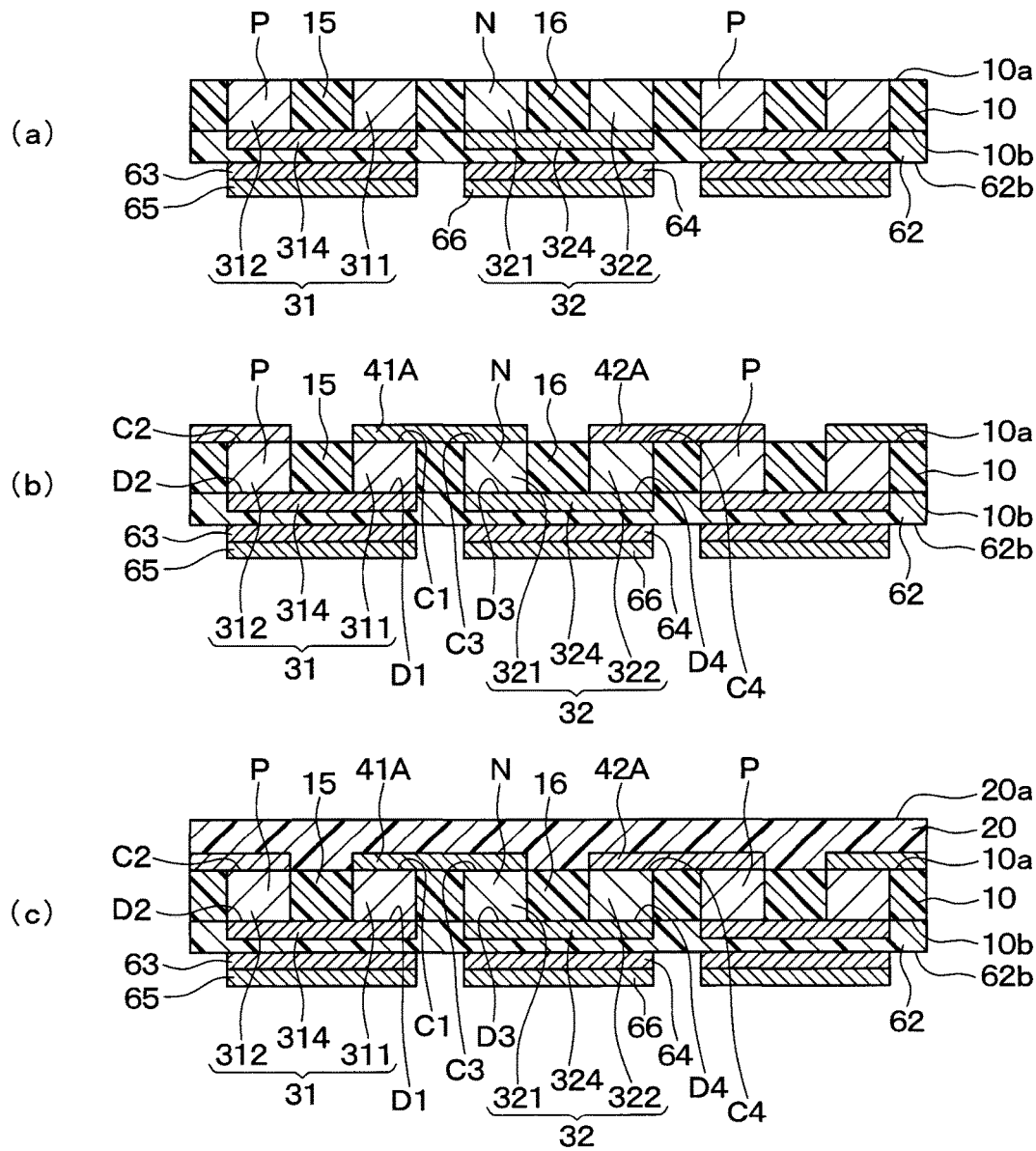
FIG. 43 is a cross-sectional view of manufacturing steps of the radiant heat sensor according to the sixteenth embodiment.

As shown in FIG. 43 by (a), the insulating substrate 10 and the back-surface protective member 62 are prepared. A laminated body in which the insulating substrate 10 and the back-surface protective member 62 are laminated is formed.

The insulating substrate 10 that is prepared is that which has undergone the steps shown in FIG. 21 by (a) to (c).

The back-surface protective member 62 that is prepared is that in which the first wiring pattern 314 and the second wiring pattern 324 are formed on one surface. The back-surface protective member 62 that is prepared is that in which the base conductor patterns 63 and 64 and the gold-plating layers 65 and 66 are formed on the other one surface 62*b*.

Then, the laminated body is heated and pressed. As a result, the insulating substrate 10 and the back-surface protective member 62 are integrated. In addition, the first extending portion 311 and the second extending portion 312 of the first thermoelectric member 31, and the third extending portion 321 and the fourth extending portion 322 of the second thermoelectric member 32 are formed by the heating that is performed at this time.

Next, as shown in FIG. 43 by (b), the first conductor pattern 41A is formed by a conductive material having high emissivity being vapor-deposited on the front surface 10*a* of the insulating substrate 10. The second conductor pattern 42A is formed by a conductive material having low emissivity being vapor-deposited on the front surface 10*a* of the insulating substrate 10.

Next, as shown in FIG. 43 by (c), the front-surface protective member 20 is prepared. A laminated body is formed by the front-surface protective member 20, the insulating substrate 10 that has undergone the step shown in FIG. 43 by (b), and the back-surface protective member 62 being laminated. Subsequently, the laminated body is heated and pressed. The radiant heat sensor 101 according to the present embodiment is manufactured in this manner.

As a result of the radiant heat sensor 101 according to the present embodiment, effects similar to those of the radiant heat sensor 101 according to the ninth and twelfth embodiment are achieved.

Other Embodiments

The present disclosure is not limited to the above-described embodiments. Modifications can be made as appropriate within the scope of the present disclosure, as described below.

(1) According to the above-described embodiments, the insulating substrate 10 is made of a thermoplastic resin. However, the insulating substrate 10 may be made of a flexible material other than thermoplastic resins. In addition, the insulating substrate 10 is not limited to thermoplastic resins and may be made of an insulating material such as a ceramic. This similarly applies to the front-surface protective member 20 and the back-surface protective member 62.

(2) According to the above-described embodiments, the first and second thermoelectric members 31 and 32 are formed by the first and second thermoelectric materials being embedded in the via holes, such as the first and second via holes 11 and 12, formed in the insulating substrate 10. However, the first and second thermoelectric members 31 and 32 may be formed by other methods. For example, the first and second thermoelectric members 31 and 32 may be alternately arrayed and joined with an insulating member therebetween, and a plate-shaped member having one surface and another surface on the side opposite the one surface may thereby be formed.

(3) The radiant heat sensors 101 according to the first to tenth embodiments include both the heat-receiving plate 51 and the reflective plate 52. However, the radiant heat sensors 101 may include only either of the heat-receiving plate 51 and the reflective plate 52. In this case as well, a temperature difference can be made to occur between the first conductor pattern 41 and the second conductor pattern 42.

(4) According to the above-described embodiments, the radiant heat sensor of the present disclosure is applied to the radiant heat measurement apparatus. However, the radiant heat sensor of the present disclosure can be applied to other apparatuses that perform various operations based on the detection results of the radiant heat sensor.

(5) The above-described embodiments are not unrelated to one another and can be combined as appropriate, excluding cases in which combining is clearly not possible. For example, the second embodiment shown in FIG. 8 can be combined with the sixth embodiment shown in FIG. 18, the eighth embodiment shown in FIG. 26, the ninth embodiment shown in FIGS. 27 and 29, the tenth embodiment shown in FIG. 30, or the eleventh embodiment shown in FIG. 31. That is, in the sixth, eighth, ninth, tenth, end eleventh embodiments, the thickness dimension D2 of the back-surface protective member 62 is set to be smaller than the interval L1 between adjacent first conductor pattern 41 and second conductor pattern 42. As a result, effects similar to those according to the second embodiment are achieved.

(6) According to the above-described embodiments, it goes without saying that elements configuring the embodiment are not necessarily requisites, excluding cases in which the element is particularly clearly indicated as being a requisite, cases in which the element can clearly be considered a requisite in principle, and the like.

While the present disclosure has been described with reference to embodiments thereof, it is to be understood that the disclosure is not limited to the embodiments and constructions. The present disclosure is intended to cover various modification examples and modifications within the range of equivalency. In addition, various combinations and configurations, and further, other combinations and configurations including more, less, or only a single element thereof are also within the spirit and scope of the present disclosure.

What is claimed is:

1. A radiant heat sensor comprising:
a plate-shaped member that has a first surface and a second surface on a side opposite the first surface, the plate-shaped member including a plurality of first thermoelectric members and a plurality of second thermoelectric members that are made of differing thermoelectric materials, in which the plurality of first thermoelectric members and the plurality of second thermoelectric members are alternately arrayed one by one in a direction along the first surface so as to be separated from each other, and each of the plurality of first thermoelectric members and plurality of second thermoelectric members configure a portion of the first surface;
a plurality of first conductor patterns that extend along the first surface, disposed on the first surface of the plate-shaped member so as to span one of the plurality of first thermoelectric members and one of the plurality of second thermoelectric members that are adjacent to each other, among the plurality of first thermoelectric members and the plurality of second thermoelectric members, and configure hot contact portions between the plurality of first thermoelectric members and the plurality of second thermoelectric members;
a plurality of second conductor patterns that extend along the first surface, disposed on the first surface of the plate-shaped member so as to span one of the plurality of first thermoelectric members and one of the plurality of second thermoelectric members that are adjacent to each other, among the plurality of first thermoelectric members and the plurality of second thermoelectric members, and configure cold contact portions between the plurality of first thermoelectric members and the plurality of second thermoelectric members;

a heat-receiving member that is made of a material having higher emissivity of radiant heat than that of the plurality of first conductor patterns and transmits heat generated as a result of absorption of radiant heat irradiated onto the first surface to the plurality of first conductor patterns; and
a first insulating layer that is disposed on the first surface of the plate-shaped member and covers the plurality of first conductor patterns, wherein
when radiant heat is irradiated onto the first surface side of the plate-shaped member, the plurality of first conductor patterns and the plurality of second conductor patterns receive heat due to the radiant heat, a temperature difference occurs between the plurality of first conductor patterns and the plurality of second conductor patterns as a result of quantities of heat received by the plurality of first conductor patterns and the plurality of second conductor patterns differing, and the plurality of first thermoelectric members and the plurality of second thermoelectric members generate electrical output based on the temperature difference,
when radiant heat is irradiated onto the first surface side, the quantities of heat received by the plurality of first conductor patterns and the plurality of second conductor patterns differ as a result of the plurality of first conductor patterns receiving heat from the heat-receiving member,
the heat-receiving member is formed in direct contact with the plurality of first conductor patterns,
the heat-receiving member is formed on a surface of the first insulating layer on a side opposite the plurality of first conductor patterns side, and
a thickness dimension of a section of the first insulating layer positioned between the plurality of first conductor patterns and the heat-receiving member is smaller than an interval between one of the plurality of first conductor patterns and one of the plurality of second conductor patterns that are adjacent to each other among the plurality of first conductor patterns and the plurality of second conductor patterns.

2. The radiant heat sensor according to claim 1, further comprising:
a reflective member that is made of a material having lower emissivity of radiant heat than that of the plurality of second conductor patterns and reflects radiant heat that is irradiated onto the first surface, wherein
when radiant heat is irradiated onto the first surface side, the quantities of heat received by the plurality of first conductor patterns and the plurality of second conductor patterns differ as a result of the radiant heat irradiated towards the plurality of second conductor patterns being reflected.

3. A radiant heat sensor comprising:
a plate-shaped member that has a first surface and a second surface on a side opposite the first surface, the plate-shaped member including a plurality of first thermoelectric members and a plurality of second thermoelectric members that are made of differing thermoelectric materials, in which the plurality of first thermoelectric members and the plurality of second thermoelectric members are alternately arrayed one by one in a direction along the first surface so as to be separated from each other, and each of the plurality of first thermoelectric members and plurality of second thermoelectric members configure a portion of the first surface;

a plurality of first conductor patterns that extend along the first surface, disposed on the first surface of the plate-shaped member so as to span one of the plurality of first thermoelectric members and one of the plurality of second thermoelectric members that are adjacent to each other, among the plurality of first thermoelectric members and the plurality of second thermoelectric members, and configure hot contact portions between the plurality of first thermoelectric members and the plurality of second thermoelectric members; and a plurality of second conductor patterns that extend along the first surface, disposed on the first surface of the plate-shaped member so as to span one of the plurality of first thermoelectric members and one of the plurality of second thermoelectric members that are adjacent to each other, among the plurality of first thermoelectric members and the plurality of second thermoelectric members, and configure cold contact portions between the plurality of first thermoelectric members and the plurality of second thermoelectric members, wherein when radiant heat is irradiated onto the first surface side of the plate-shaped member, the plurality of first conductor patterns and the plurality of second conductor patterns receive heat due to the radiant heat, a temperature difference occurs between the plurality of first conductor patterns and the plurality of second conductor patterns as a result of quantities of heat received by the plurality of first conductor patterns and the plurality of second conductor patterns differing, and the plurality of first thermoelectric members and the plurality of second thermoelectric members generate electrical output based on the temperature difference, the plurality of first conductor patterns are made of a material having higher emissivity of radiant heat than that of the plurality of second conductor patterns, and when radiant heat is irradiated onto the first surface side, the quantities of heat received by the plurality of first conductor patterns and the plurality of second conductor patterns differ as a result of the plurality of first conductor patterns absorbing more heat than the plurality of second conductor patterns.

4. A radiant heat sensor comprising:

a plate-shaped member that has a first surface and a second surface on a side opposite the first surface, the plate-shaped member including a plurality of first thermoelectric members and a plurality of second thermoelectric members that are made of differing thermoelectric materials, in which the plurality of first thermoelectric members and the plurality of second thermoelectric members are alternately arrayed one by one in a direction along the first surface so as to be separated from each other, and each of the plurality of first thermoelectric members and plurality of second thermoelectric members configure a portion of the first surface;

a plurality of first conductor patterns that extend along the first surface, disposed on the first surface of the plate-shaped member so as to span one of the plurality of first thermoelectric members and one of the plurality of second thermoelectric members that are adjacent to each other, among the plurality of first thermoelectric members and the plurality of second thermoelectric members, and configure hot contact portions between the plurality of first thermoelectric members and the plurality of second thermoelectric members;

a plurality of second conductor patterns that extend along the first surface, disposed on the first surface of the plate-shaped member so as to span one of the plurality of first thermoelectric members and one of the plurality of second thermoelectric members that are adjacent to each other, among the plurality of first thermoelectric members and the plurality of second thermoelectric members, and configure cold contact portions between the plurality of first thermoelectric members and the plurality of second thermoelectric members; and an insulating layer disposed on the second surface of the plate-shaped member covering the plurality of first thermoelectric members and the plurality of second thermoelectric members, wherein when radiant heat is irradiated onto the first surface side of the plate-shaped member, the plurality of first conductor patterns and the plurality of second conductor patterns receive heat due to the radiant heat, a temperature difference occurs between the plurality of first conductor patterns and the plurality of second conductor patterns as a result of quantities of heat received by the plurality of first conductor patterns and the plurality of second conductor patterns differing, and the plurality of first thermoelectric members and the plurality of second thermoelectric members generate electrical output based on the temperature difference, and a thickness dimension of the insulating layer is smaller than an interval between one of the plurality of first conductor patterns and one of the plurality of second conductor patterns that are adjacent to each other among the plurality of first conductor patterns and the plurality of second conductor patterns.

5. A radiant heat sensor comprising:

a plate-shaped member that has a first surface and a second surface on a side opposite the first surface, the plate-shaped member including a plurality of first thermoelectric members and a plurality of second thermoelectric members that are made of differing thermoelectric materials, in which the plurality of first thermoelectric members and the plurality of second thermoelectric members are alternately arrayed one by one in a direction along the first surface so as to be separated from each other, and each of the plurality of first thermoelectric members and plurality of second thermoelectric members configure a portion of the first surface;

a plurality of first conductor patterns that extend along the first surface, disposed on the first surface of the plate-shaped member so as to span one of the plurality of first thermoelectric members and one of the plurality of second thermoelectric members that are adjacent to each other, among the plurality of first thermoelectric members and the plurality of second thermoelectric members, and configure hot contact portions between the plurality of first thermoelectric members and the plurality of second thermoelectric members; and a plurality of second conductor patterns that extend along the first surface, disposed on the first surface of the plate-shaped member so as to span one of the plurality of first thermoelectric members and one of the plurality of second thermoelectric members that are adjacent to each other, among the plurality of first thermoelectric members and the plurality of second thermoelectric members, and configure cold contact portions between the plurality of first thermoelectric members and the plurality of second thermoelectric members, wherein when radiant heat is irradiated onto the first surface side of the plate-shaped member, the plurality of first conductor patterns and the plurality of second conductor patterns receive heat due to the radiant heat, a temperature difference occurs between the plurality of first conductor patterns and the plurality of second conductor patterns as a result of quantities of heat received by the plurality of first conductor patterns and the plurality of second conductor patterns differing, and the plurality of first thermoelectric members and the plurality of second thermoelectric members generate electrical output based on the temperature difference, the plurality of first thermoelectric members include
- a first extending portion that is made of a first thermoelectric material and extends from a first contacting end portion that is in contact with the plurality of first conductor patterns towards the second surface side of the plate-shaped member,
- a second extending portion that is made of the first thermoelectric material and extends from a second contacting end portion that is in contact with the plurality of second conductor patterns towards the second surface side of the plate-shaped member, and
- a first coupling portion that is made of the first thermoelectric material, positioned to span from a section of the first extending portion on the second surface side of the plate-shaped member to a section of the second extending member on the second surface side of the plate-shaped member, and couples the first extending portion and the second extending portion, and a heat insulating member that has lower thermal conductance than the plurality of first thermoelectric members is disposed between the first extending portion and the second extending portion in a direction along the first surface.

6. The radiant heat sensor according to claim 5, wherein:
the plurality of second thermoelectric members include
- a third extending portion that is made of a second thermoelectric material and extends from a third contacting end portion that is in contact with the plurality of first conductor patterns towards the second surface side of the plate-shaped member,
- a fourth extending portion that is made of the second thermoelectric material and extends from a fourth contacting end portion that is in contact with the plurality of second conductor patterns towards the second surface side of the plate-shaped member, and
- a second coupling portion that is made of the second thermoelectric material, positioned to span from a section of the third extending portion on the second surface side of the plate-shaped member to a section of the fourth extending member on the second surface side of the plate-shaped member, and couples the third extending portion and the fourth extending portion, and a heat insulating member that has lower thermal conductance than the second thermoelectric member is disposed between the third extending portion and the fourth extending portion in the direction along the first surface.

7. A radiant heat sensor comprising:
a plate-shaped member that has a first surface and a second surface on a side opposite the first surface, the plate-shaped member including a plurality of first thermoelectric members and a plurality of second thermoelectric members that are made of differing thermoelectric materials, in which the plurality of first thermoelectric members and the plurality of second thermoelectric members are alternately arrayed one by one in a direction along the first surface so as to be separated from each other, and each of the plurality of first thermoelectric members and plurality of second thermoelectric members configure a portion of the first surface;

a plurality of first conductor patterns that extend along the first surface, disposed on the first surface of the plate-shaped member so as to span one of the plurality of first thermoelectric members and one of the plurality of second thermoelectric members that are adjacent to each other, among the plurality of first thermoelectric members and the plurality of second thermoelectric members, and configure hot contact portions between the plurality of first thermoelectric members and the plurality of second thermoelectric members; and a plurality of second conductor patterns that extend along the first surface, disposed on the first surface of the plate-shaped member so as to span one of the plurality of first thermoelectric members and one of the plurality of second thermoelectric members that are adjacent to each other, among the plurality of first thermoelectric members and the plurality of second thermoelectric members, and configure cold contact portions between the plurality of first thermoelectric members and the plurality of second thermoelectric members, wherein when radiant heat is irradiated onto the first surface side of the plate-shaped member, the plurality of first conductor patterns and the plurality of second conductor patterns receive heat due to the radiant heat, a temperature difference occurs between the plurality of first conductor patterns and the plurality of second conductor patterns as a result of quantities of heat received by the plurality of first conductor patterns and the plurality of second conductor patterns differing, and the plurality of first thermoelectric members and the plurality of second thermoelectric members generate electrical output based on the temperature difference, the plurality of first thermoelectric members include
- a first extending portion that is made of a first thermoelectric material and extends from a first contacting end portion that is in contact with the plurality of first conductor patterns towards the second surface side of the plate-shaped member,
- a second extending portion that is made of the first thermoelectric material and extends from a second contacting end portion that is in contact with the plurality of second conductor patterns towards the second surface side of the plate-shaped member, and
- a first wiring pattern that is disposed on the second surface of the plate-shaped member so as to span the first extending portion and the second extending portion, and electrically connects the first extending portion and the second extending portion, and a heat insulating member that has lower thermal conductance than the plurality of first thermoelectric members is disposed between the first extending portion and the second extending portion in a direction along the first surface.

8. The radiant heat sensor according to claim 7, wherein:
the plurality of second thermoelectric members include
- a third extending portion that is made of a second thermoelectric material and extends from a third contacting end portion that is in contact with the plurality of first conductor patterns towards the second surface side of the plate-shaped member,
- a fourth extending portion that is made of the second thermoelectric material and extends from a fourth contacting end portion that is in contact with the plurality of second conductor patterns towards the second surface side of the plate-shaped member, and a second wiring pattern that is disposed on the second surface of the plate-shaped member so as to span the third extending portion and the fourth extending portion, and electrically connects the third extending portion and the fourth extending portion, and a heat insulating member that has lower thermal conductance than the plurality of second thermoelectric members is disposed between the third extending portion and the fourth extending portion in the direction along the first surface.

9. The radiant heat sensor according to claim 8, further comprising:

an insulating layer that is disposed on a side of the plurality of second wiring patterns opposite the plate-shaped member side; and a second heat conducting member that is disposed on a surface of the insulating layer on a side opposite the second wiring pattern side and has higher thermal conductance than the insulating layer, wherein the second heat conducting member is disposed in an area that extends from a position opposing at least a portion of a third connecting portion between the plurality of second wiring patterns and the third extending portion in a direction perpendicular to the first surface to a position opposing at least a portion of a fourth connecting portion between the plurality of second wiring patterns and the fourth extending portion in the direction perpendicular to the first surface.

10. The radiant heat sensor according to claim 9, wherein:

a thickness dimension of the insulating layer is smaller than an interval between one of the plurality of first conductor patterns and one of the plurality of second conductor patterns that are adjacent to each other among the plurality of first conductor patterns and the plurality of second conductor patterns.

11. The radiant heat sensor according to claim 7, further comprising:

an insulating layer that is disposed on a side of the plurality of first wiring patterns opposite the plate-shaped member side; and a first heat conducting member that is disposed on a surface of the insulating layer on a side opposite the first wiring pattern side and has higher thermal conductance than the insulating layer, wherein the first heat conducting member is disposed in an area that extends from a position opposing at least a portion of a first connecting portion between the plurality of first wiring patterns and the first extending portion in a direction perpendicular to the first surface to a position opposing at least a portion of a second connecting portion between the plurality of first wiring patterns and the second extending portion in the direction perpendicular to the first surface.

12. The radiant heat sensor according to claim 11, wherein:

a thickness dimension of the insulating layer is smaller than an interval between one of the plurality of first conductor patterns and one of the plurality of second conductor patterns that are adjacent to each other among the plurality of first conductor patterns and the plurality of second conductor patterns.

* * * * *